(12) United States Patent
Nakao et al.

(10) Patent No.: US 7,764,264 B2
(45) Date of Patent: Jul. 27, 2010

(54) DISPLAY DEVICE WITH BIDIRECTIONAL SHIFT REGISTER AND SET-RESET FLIP FLOPS WITH CAPACITORS THAT USE SCANNING DIRECTION CONTROL SIGNALS AS SETTING AND RESETTING POTENTIALS

(75) Inventors: Takayuki Nakao, Atsugi (JP); Masahiro Maki, Mobara (JP); Hideo Sato, Hitachi (JP); Toshio Miyazawa, Chiba (JP)

(73) Assignee: Hitachi Displays, Ltd., Chiba-ken (JP)

( * ) Notice: Subject to any disclaimer, the term of this patent is extended or adjusted under 35 U.S.C. 154(b) by 902 days.

(21) Appl. No.: 11/600,757

(22) Filed: Nov. 17, 2006

(65) Prior Publication Data

US 2007/0115245 A1 May 24, 2007

(30) Foreign Application Priority Data

Nov. 18, 2005 (JP) ............................. 2005-334599

(51) Int. Cl.
G09G 3/36 (2006.01)
G09G 5/00 (2006.01)
G11C 19/00 (2006.01)

(52) U.S. Cl. ........................................ 345/100; 377/64
(58) Field of Classification Search .................. 345/92, 345/98–100, 204; 377/64–81, 85, 125–126
See application file for complete search history.

(56) References Cited

U.S. PATENT DOCUMENTS

| 5,282,234 | A | * | 1/1994 | Murayama et al. | ............. | 377/69 |
| 5,894,296 | A | * | 4/1999 | Maekawa | ..................... | 345/98 |
| 6,437,775 | B1 | * | 8/2002 | Hanari | ........................ | 345/204 |
| 6,580,411 | B1 | * | 6/2003 | Kubota et al. | ................. | 345/98 |

(Continued)

FOREIGN PATENT DOCUMENTS

JP 3329008 6/1993

(Continued)

*Primary Examiner*—Amr Awad
*Assistant Examiner*—Liliana Cerullo
(74) *Attorney, Agent, or Firm*—Stites & Harbison PLLC; Juan Carlos A. Marquez, Esq.

(57) ABSTRACT

The present invention provides a display device that has a driving circuit including a single channel bidirectional shift register with which the circuit scale can be reduced without increasing the number of elements.

The driving circuit includes a single channel bidirectional shift register. This single channel bidirectional shift register has an RS flip-flop circuit. The RS flip-flop circuit includes a first transistor having a first electrode connected to an output terminal and having a second electrode to which a second scanning direction control signal is applied and a second transistor having a first electrode connected to an output terminal and having a second electrode to which a first scanning direction control signal is applied. In this circuit configuration, a resetting signal is applied to a control electrode of the first transistor in a first scanning direction, a setting signal is applied to the control electrode of the first transistor in a second scanning direction which is a direction opposite to the first scanning direction. The setting signal is also applied to a control electrode of the second transistor in the first scanning direction, and the resetting signal is also applied to the control electrode of the second transistor in the second scanning direction.

32 Claims, 19 Drawing Sheets

U.S. PATENT DOCUMENTS

| | | | |
|---|---|---|---|
| 6,801,194 B2* | 10/2004 | Miyazawa et al. | 345/204 |
| 6,937,687 B2* | 8/2005 | Yu | 377/69 |
| 2003/0174115 A1* | 9/2003 | Washio et al. | 345/98 |
| 2003/0179174 A1* | 9/2003 | Matsuda et al. | 345/100 |
| 2004/0113878 A1* | 6/2004 | Park | 345/92 |
| 2004/0150610 A1* | 8/2004 | Zebedee et al. | 345/100 |

FOREIGN PATENT DOCUMENTS

JP  2002-215118  9/2001

* cited by examiner

Prior Art FIG. 18
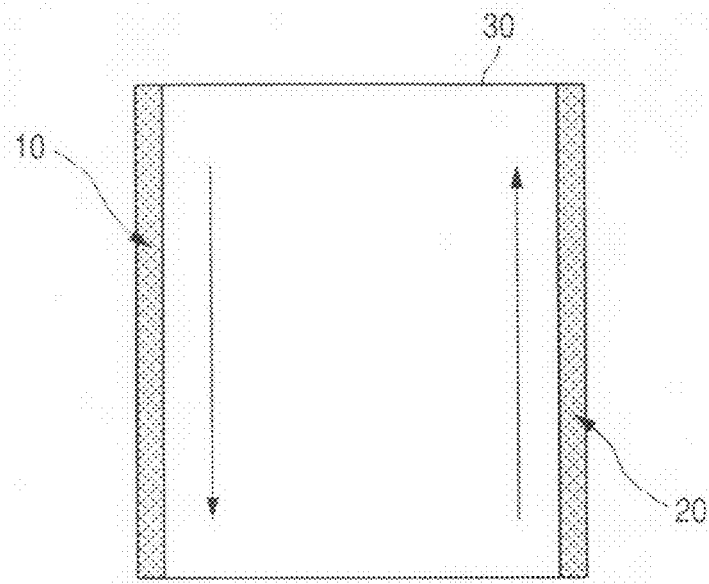
Prior Art FIG. 19A
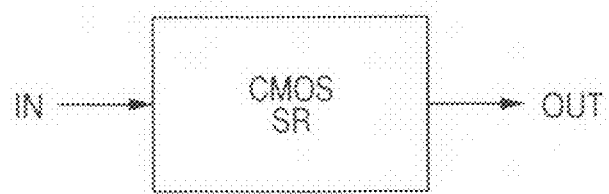
Prior Art FIG. 19B
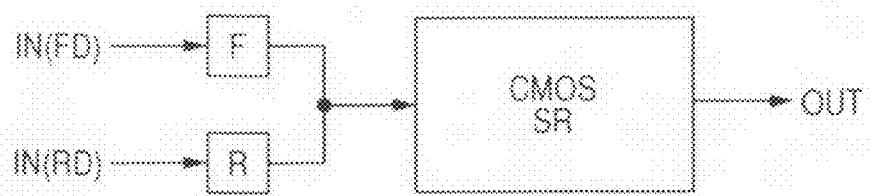

DISPLAY DEVICE WITH BIDIRECTIONAL SHIFT REGISTER AND SET-RESET FLIP FLOPS WITH CAPACITORS THAT USE SCANNING DIRECTION CONTROL SIGNALS AS SETTING AND RESETTING POTENTIALS

CLAIM OF PRIORITY

The present application claims priority from Japanese Application JP 2005-334599 filed on Nov. 18, 2005, the content of which is hereby incorporated by reference into this application.

BACKGROUND OF THE INVENTION

1. Field of the Invention

The present invention relates to display devices, and more particularly to a display device with a driving circuit including a single channel bidirectional shift register.

2. Description of the Related Art

In recent years, active-matrix liquid crystal display devices that use thin-film transistors (TFTs) as their active elements have been employed in digital still cameras, cell phones, and the like.

In these configurations, digital still cameras, cell phones, and the like may require a liquid crystal display panel that enables bidirectional display.

For a liquid crystal display panel enabling bidirectional display mentioned above, it is considered to provide a technique for incorporating two shift registers: a shift register for forward scanning and a shift register for reverse scanning, like a forward vertical scanning circuit 10 and a reverse vertical scanning circuit 20 included in a liquid crystal display panel 30 shown in FIG. 18.

In this technique, however, the circuit scale is almost doubled and this results in reduced yield, so it becomes necessary to reduce the circuit scale if an additional circuit is required in the future.

In general, a CMOS shift register has a single input (IN) and a single output (OUT) per stage as shown in FIG. 19A. As shown in FIG. 19B, therefore, bidirectional scanning control can be realized with a single circuit at one side in a simple circuit configuration which employs signal routing switch elements (F, R).

However, a single channel shift register using N-type MOSFETs, for instance, has three inputs (IN, SET, and RESET) and a single output (OUT) per stage as shown in FIG. 20A. In addition, since the single channel shift register further requires a preceding stage and a following stage, a bidirectional circuit configuration with signal routing switch elements (F, R) becomes complex and increases in the number of elements required, as shown in FIG. 20B.

Literature on conventional techniques relating to this Application includes the following:

[Patent Document 1]
Japanese Patent Laid-Open No. Hei 07-13513

]Patent Document 2]
Japanese Patent Laid-Open No. 2002-215118

SUMMARY OF THE INVENTION

As outlined above, although it is advantageous in terms of circuit configuration to realize a bidirectional shift register with CMOS circuit configuration, there is a problem that manufacturing processes increase.

Also, realizing a bidirectional shift register with single channel circuit configuration makes it possible to reduce manufacturing processes, adopting the shift register increases the number of elements required and makes the circuit configuration complicated.

The present invention was made in order to solve these problems associated with the foregoing conventional techniques, and an object of the invention is to provide a display device that has a driving circuit including a single channel bidirectional shift register which, compared with a conventional shift register, can be reduced in circuit scale without increasing the number of elements.

These and other objects and new features of the present invention will be made apparent from the following description of this Specification and the accompanying drawings.

Typical aspects of the invention disclosed in this Application are briefly outlined below.

In order to solve the above-mentioned problems, the present invention provides a display device including a plurality of pixels and a driving circuit for driving the plurality of pixels, wherein the driving circuit has a single channel bidirectional shift register capable of conducting bidirectional scanning in a first direction and a second direction. Basic circuits of the single channel bidirectional shift register each include a first RS flip-flop circuit and a second RS flip-flop circuit. The first RS flip-flop circuit has a first transistor having a first electrode connected to an output terminal, a second electrode connected to a second scanning control line to which a second scanning direction control signal is supplied, and a control electrode connected to an output terminal of a basic circuit on the side of a preceding stage during scanning in the first scanning direction. The first RS flip-flop circuit also has a second transistor having a first electrode connected to an output terminal, a second electrode connected to a first scanning control line to which a first scanning direction control signal is supplied, and a control electrode connected to an output terminal of a basic circuit on the side of a following stage side during scanning in the first scanning direction. The second RS flip-flop circuit has a third transistor having a first electrode connected to an output terminal, a second electrode connected to the second scanning control line, and a control electrode connected to an output terminal of a basic circuit on the side of the following stage during scanning in the first scanning direction. The second RS flip-flop circuit also has a fourth transistor having a first electrode connected to an output terminal, a second electrode connected to the first scanning control line, and a control electrode connected to an output terminal of a basic circuit on side of the preceding stage during scanning in the first scanning direction. Additionally, each basic circuit further includes: a fifth transistor having a control electrode connected to an output terminal of the first RS flip-flop circuit, a second electrode connected to an output terminal of the second RS flip-flop circuit, and a first electrode connected to a reference potential line to which a reference potential is supplied; a sixth transistor having a control electrode connected to the second electrode of the fifth transistor, a first electrode connected to a clock terminal, and a second electrode connected to an output terminal of the basic circuit; and a first capacitive element connected between the control electrode and second electrode of the sixth transistor.

That is to say, the single channel bidirectional shift register of the present invention applies a scanning direction control signal to the second electrode of any one of the first to fourth transistors and determines a scanning direction based on a potential obtained.

In this way, the present invention, unlike the conventional techniques, not only uses a scanning direction control signal to control a signal path, but also obtains the signal as a setting potential or a resetting potential into a circuit. At the same time, the present invention has a function of a diode for holding a potential in the first to fourth transistors.

Typical advantageous effects of the invention disclosed in this Application are briefly outlined below.

According to the present invention, it is possible to provide a display device that has a driving circuit including a single channel bidirectional shift register which, compared with a conventional shift register, can be reduced in circuit scale without increasing the number of elements.

BRIEF DESCRIPTION OF THE DRAWINGS

FIG. 18 is a diagram showing an example of a liquid crystal display panel that enables bidirectional display;

FIG. 19A is a diagram showing a schematic configuration of one stage of a CMOS shift register;

FIG. 19B is a diagram showing a schematic configuration of one stage of a CMOS bidirectional shift register;

DESCRIPTION OF THE PREFERRED EMBODIMENTS

Embodiments of the present invention will be described in detail hereunder with reference to the accompanying drawings.

In the diagrams that explain the embodiment, elements with the same function are each assigned the same reference numbers or symbols, and repeated description of each such element is omitted.

Figure 1:
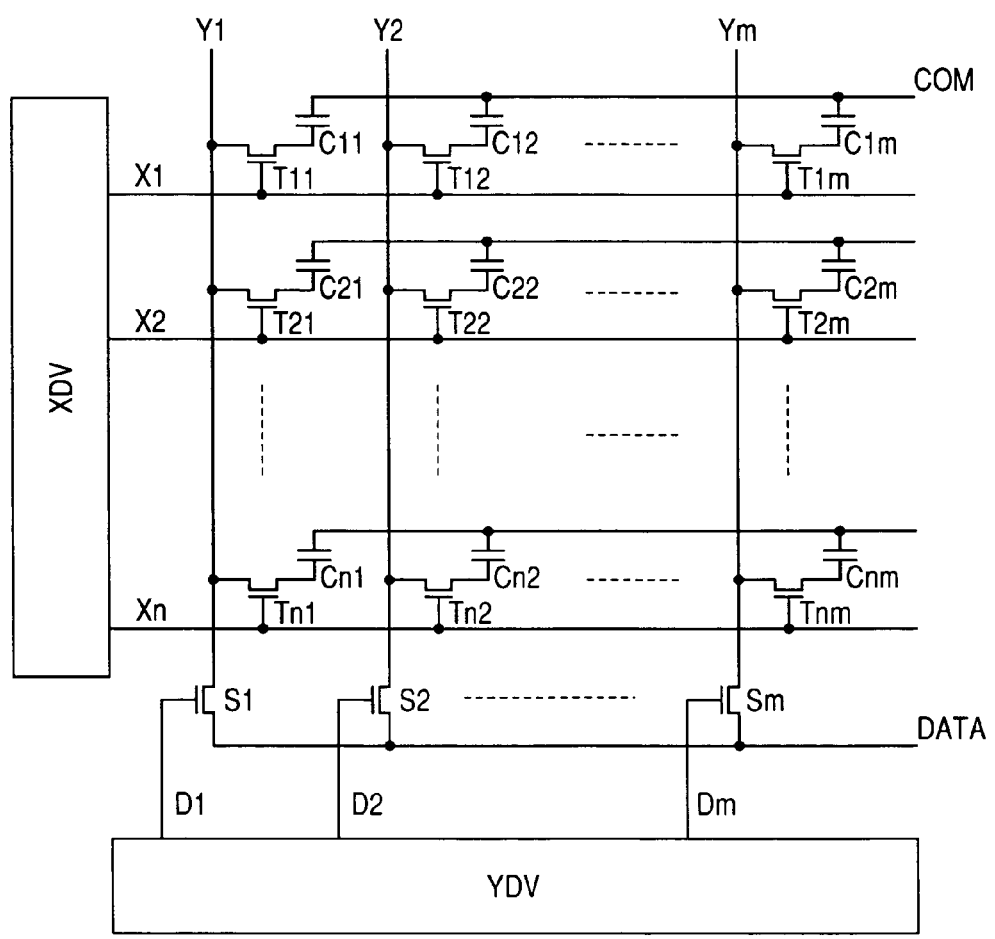
FIG. 1 is a circuit diagram showing an equivalent circuit of an active-matrix liquid crystal display device according to an embodiment of the present invention.

FIG. 1 is a circuit diagram showing an equivalent circuit of an active-matrix liquid crystal display device according an embodiment of the present invention.

As shown in FIG. 1, the active-matrix liquid crystal display device of the present embodiment includes an "n" number of gate lines and an "m" number of drain lines on a liquid crystal surface of one of a pair of substrates opposed to each other via a liquid crystal. The "n" number of gate lines (X1, X2, etc. up to Xn) are provided in a y-direction in parallel to one another and extend in an x-direction, and the "m" number of drain lines (Y1, Y2, etc. up to Ym) are provided in the x-direction in parallel to one another and extend in the y-direction.

Regions each surrounded by one gate line (also referred to as a scan line) and one drain line (also referred to as an image line) are pixel regions. In one pixel region, a thin film transistor (Tnm) is provided. The thin film transistor has a gate connected to a gate line, a drain (or source) connected to a drain line, and a source (or drain) connected to a pixel electrode. In addition, a hold capacitance (Cnm) is disposed between the pixel electrode and a common electrode (COM).

The gate lines (X1, X2, etc. up to Xn) are each connected to a vertical driving circuit (XDR) that supplies a gate signal to each gate line in sequence from X1 to Xn (forward scanning) or to each gate line in sequence from Xn to X1 (reverse scanning).

The drain lines (Y1, Y2, etc. up to Ym) are each connected to a drain (or source) of a switch element (S1, S2 . . . , Sm).

The source (or drain) of the switch element (S1, S2 . . . , Sm) is connected to an image signal line (DATA), and a gate of the switch element is connected to a horizontal driving circuit (YDV).

The horizontal driving circuit (YDV) conducts sequential forward scanning from the switch element S1 toward the switch element Sm or sequential reverse scanning from Sm toward S1.

Figure 2:
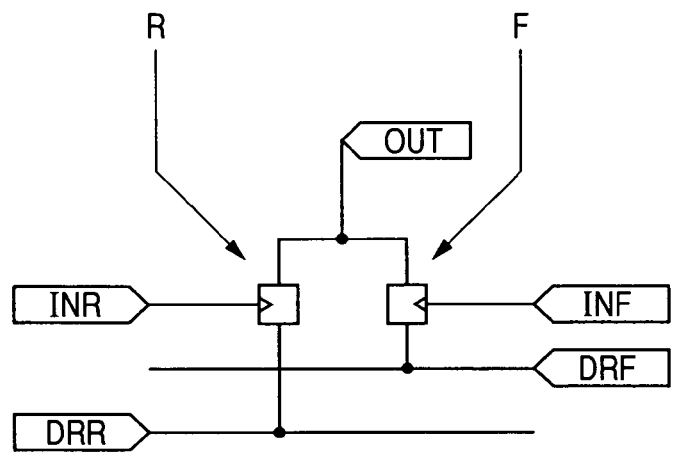
FIG. 2 is a circuit diagram that explains operating principles of a bidirectional scanning circuit applied to a vertical driving circuit (XDV) or horizontal driving circuit (YDV) according to the embodiment of the present invention.

FIG. 2 is a circuit diagram that explains operating principles of a bidirectional scanning circuit applied to the vertical driving circuit (XDV) or horizontal driving circuit (YDV) of the present embodiment.

The circuit shown in FIG. 2 includes two switch elements (F, R), and the switch element F has a drain (or source) connected to a DRF terminal, and a gate connected to an INF terminal. The switch element R has a drain (or source) connected to a DRR terminal, and a gate connected to an INR terminal.

The sources (or drains) of both the switch elements (F, R) are connected to an OUT terminal.

In the circuit of FIG. 2, the switch elements (F, R) use an n-type of thin-film transistor (NMOS). For example, it is assumed that a signal takes a high level (hereinafter, referred to as H-level) at the DRF terminal and takes a low level (hereinafter, referred to as L-level) at the DRR terminal. In the assumption, when an H-level signal is input to the INF terminal, the H-level (more accurately, a voltage level obtained by subtracting the threshold voltage (Vth) of the switch element F from the H-level applied to the INF terminal) is output to the OUT terminal. When the H-level signal is input to the INR terminal, the L-level is output to the OUT terminal.

If the input signal is in the L-level state, the OUT terminal holds the state. However, simultaneous input of the H-level signal to both the INF terminal and the INR terminal is inhibited.

With the above configuration, the circuit shown in FIG. 2 functions as an RS flip-flop circuit.

Assume that scanning direction control signals for controlling the scanning directions of the bidirectional scanning circuit are DRF (first scanning direction control signal in the invention of this Application) and DRR (second scanning direction control signal in the invention of this Application). Also, assume that when DRF and DRR are of the H-level and the L-level, respectively, scanning is conducted in a forward direction (first scanning direction in the invention of this Application) and that when DRF and DRR are of the L-level and the H-level, respectively, scanning is conducted in a reverse direction (second scanning direction in the invention of this Application).

When the scanning direction control signals are applied to the respective DRF terminal and DRR terminal of the RS flip-flop circuit, the INF terminal to which a setting signal is applied during forward scanning assumes a H-level output state at the H-level, whereas the INR terminal to which a resetting signal is applied during forward scanning assumes an L-level output state at the H-level. The INF terminal to which the resetting signal is applied during reverse scanning assumes an L-level output state at the H-level, whereas the INR terminal to which the setting signal is applied during reverse scanning assumes an H-level output state at the H-level.

Figure 3:
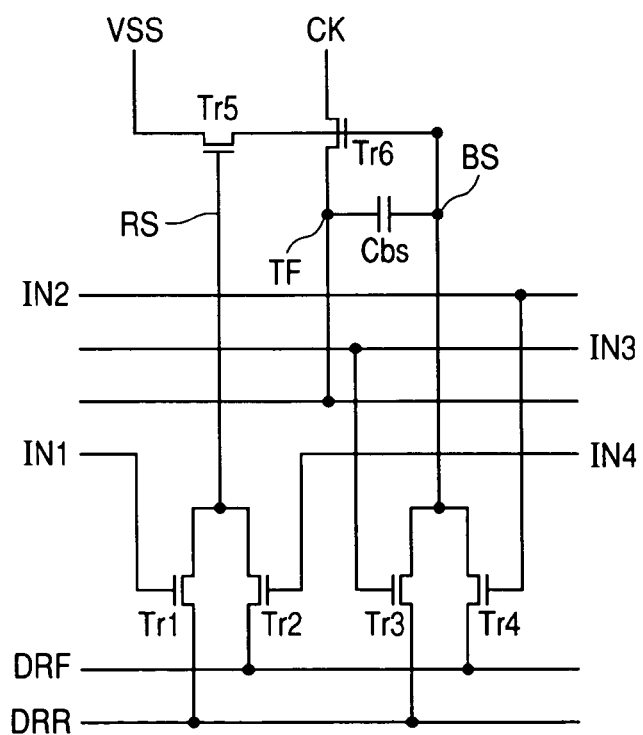
FIG. 3 is a circuit diagram showing a basic circuit which conducts one-line scanning in the bidirectional scanning circuit applied to the vertical driving circuit (XDV) or horizontal driving circuit (YDV) according to the embodiment of the present invention.

FIG. 3 is a circuit diagram showing a basic circuit (which conducts one-line scanning) of the bidirectional scanning circuit applied to the vertical driving circuit (XDV) or horizontal driving circuit (YDV) of the present embodiment.

The circuit shown in FIG. 3 includes two RS flip-flop circuits. One of the RS flip-flop circuits has an NMOS (Tr1) and an NMOS (Tr2), both of which use a source (or a drain) as a common electrode.

The scanning direction control signal DRR is applied to the drain (or source) of the NMOS (Tr1), and a gate thereof is connected to an IN1 terminal. The scanning direction control signal DRF is applied to the drain (or source) of the NMOS (Tr2), and a gate thereof is connected to an IN4 terminal.

The other RS flip-flop circuit has an NMOS (Tr3) and an NMOS (Tr4), both of which use a source (or a drain) as a common electrode.

The scanning direction control signal DRR is applied to the drain (or source) of the NMOS (Tr3), and a gate thereof is connected to an IN3 terminal. The scanning direction control signal DRF is applied to the drain (or source) of the NMOS (Tr4), and a gate thereof is connected to an IN2 terminal.

The source (or drain) of the NMOS (Tr1) or of the NMOS (Tr2) is connected to the gate of the NMOS (Tr5), and the drain (or source) of the NMOS (Tr5) is connected to the gate of the NMOS (Tr6), and the source (or drain) of the NMOS (Tr5) is connected to a VSS terminal.

The source (or drain) of the NMOS (Tr3) or of the NMOS (Tr4) is connected to the gate of the NMOS (Tr6), and the source or drain) of the NMOS (Tr6) is connected to a CK terminal.

The VSS terminal is connected to a reference potential line of VSS equivalent to the L-level of the signal, and the CK terminal is connected to a clock signal line.

In addition, a capacitive element (Cbs) is connected between the drain (or source) of the NMOS (Tr6) and the gate thereof.

The drain (or source) of the NMOS (Tr6), in other words, a TF node operates as a signal output node and scanning signal output node that transmits the signal to a next stage.

Figure 4A:
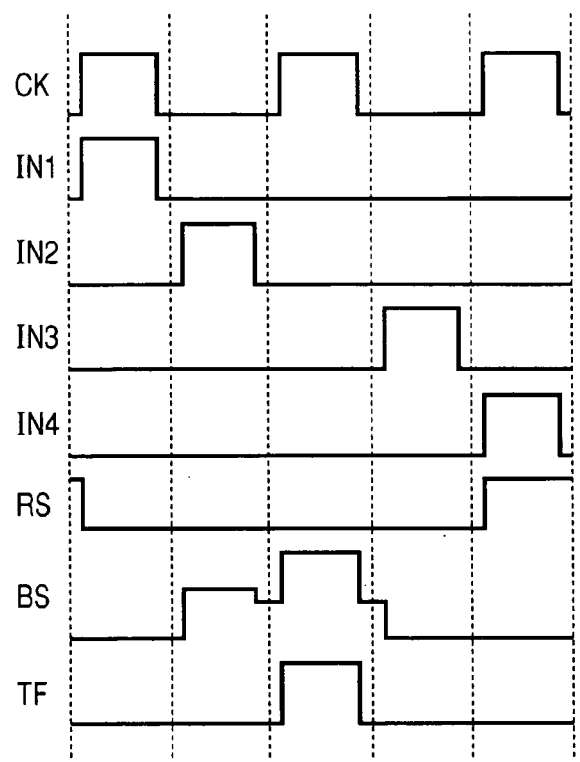
FIG. 4A is a timing chart obtained when a scanning direction control signal DRF takes an H-level and a scanning direction control signal DRR takes an L-level in the basic circuit of FIG. 3.

In the basic circuit of FIG. 3, when the scanning direction control signal DRF takes the H-level and the scanning direction control signal DRR takes the L-level, a timing chart obtained is as shown in FIG. 4A.

When a signal of the H-level is input to the IN1 terminal, the L-level is applied to the gate of the NMOS (Tr5) via the NMOS (Tr1) and thus an RS node takes the L-level.

Accordingly, the NMOS (Tr5) is turned off, which then makes a BS node become a floating state and thus enables writing.

Next, when the signal of the H-level is input to the IN2 terminal, a potential of the H-level (more accurately, a voltage level obtained by subtracting the threshold voltage (Vth) of the NMOS (Tr4) from the H-level of the scanning direction control signal DRF) is written into the BS node via the NMOS (Tr4). Thus, the BS node enters an H-level state and as a result, the NMOS (Tr6) is turned on and an L-level of the clock signal is written into the TF node.

When the terminals IN1 to IN4 are of the L-level, the BS node becomes the floating state. When the H-level of the clock signal is input to the CK terminal while the BS node is in an H-level state, a potential obtained by subtracting the threshold voltage (Vth) of the NMOS (Tr6) from the H-level is written into the TF node via the NMOS (Tr6).

At this time, a bootstrap effect raises the potential of the BS node via the capacitive element (Cbs), and the clock signal of the H-level equivalent to the input clock signal of the H-level is written into the TF node.

Next, the signal of the H-level is input to the IN3 terminal and the BS node takes the L-level of the scanning direction control signal DRR.

The signal of the H-level is further input to the IN4 terminal, and the RS node assumes a potential obtained by subtracting the threshold voltage (Vth) of the NMOS (Tr2) from the H-level and keeps the state.

Thus, the NMOS (Tr5) subsequently is turned on and the BS node always holds the reference potential of VSS.

Figure 4B:
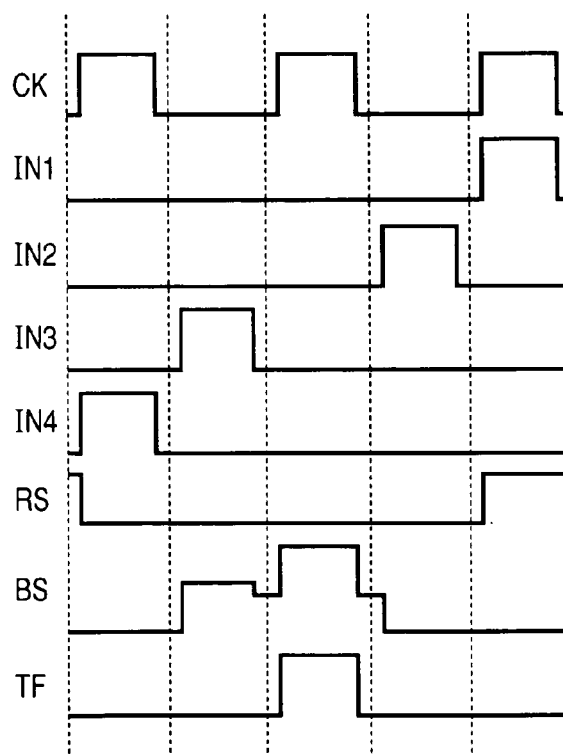
FIG. 4B is a timing chart obtained when the scanning direction control signal DRF takes the L-level and the scanning direction control signal DRR takes the H-level in the basic circuit of FIG. 3.

In the basic circuit of FIG. 3, when the scanning direction control signal DRF takes the L-level and the scanning direction control signal DRR takes the H-level, a timing chart obtained is as shown in FIG. 4B.

During scanning in the first scanning direction according to the invention of this Application, that is, when the scanning direction control signal DRF is of the H-level and the scanning direction control signal DRR is of the L-level, the signal of the H-level is applied to the IN1 terminal, the IN2 terminal, the IN3 terminal, and the IN4 terminal, in that order. However, during scanning in the second scanning direction according to the invention of this Application, that is, when the scanning direction control signal DRF is of the L-level and the scanning direction control signal DRR is of the H-level, the signal of the H-level is applied to the IN4 terminal, the IN3 terminal, the IN2 terminal, and the IN1 terminal, in that order.

Even when signals of the same timing are input, the IN1, IN2, IN3, and IN4 terminals are able to operate. However, since the timing of setting the RS node to the L-level and the timing of writing the H-level potential into the BS node are the same, the DRF terminal or the DRR terminal and the VSS terminal may be connected directly to each other. In order to prevent these terminals from being directly connected, the IN1 terminal and the IN2 terminal are separated from each other and the IN3 terminal and the IN4 terminal are separated from each other.

An "n" number of basic circuits shown in FIG. 3 are connected having multiple stages to configure a bidirectional scanning circuit.

Figure 5:
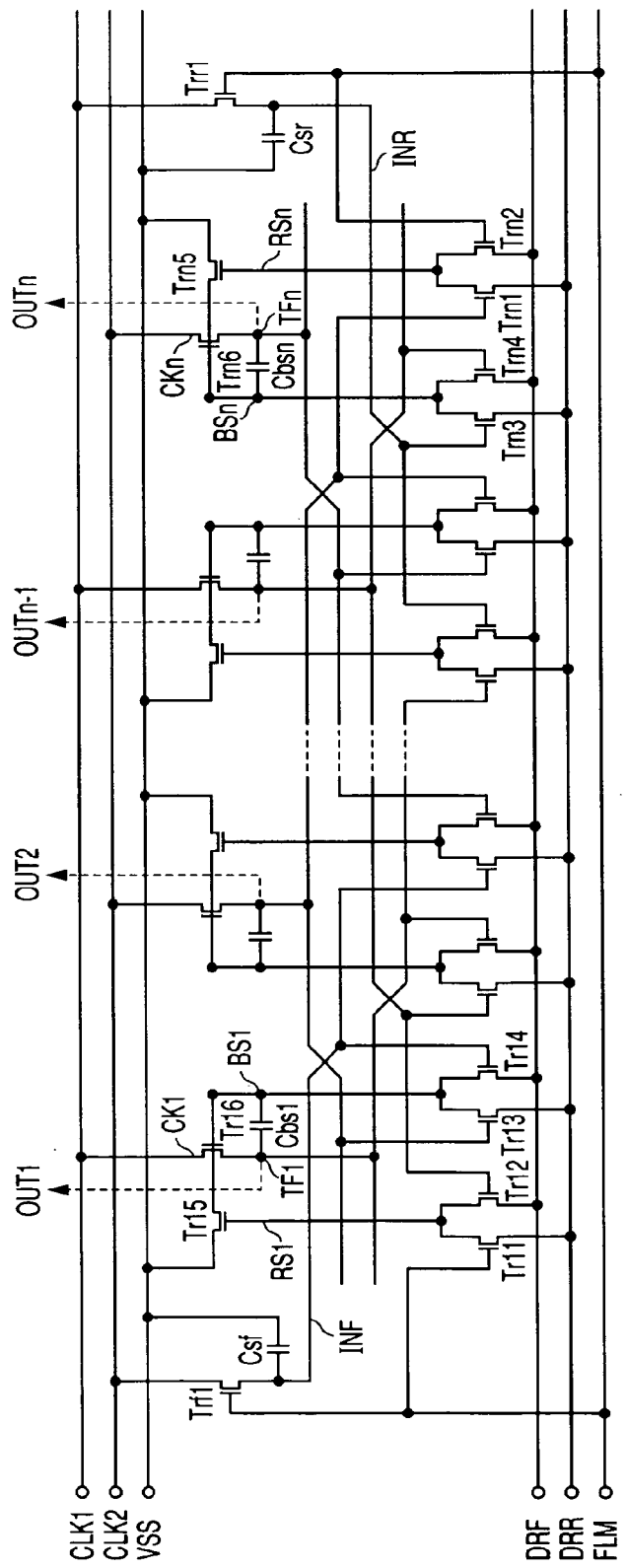
FIG. 5 is a circuit diagram showing a bidirectional scanning circuit configured by connecting an "n" number of basic circuits of FIG. 3 where the "n" is an even number.
Figure 6A:
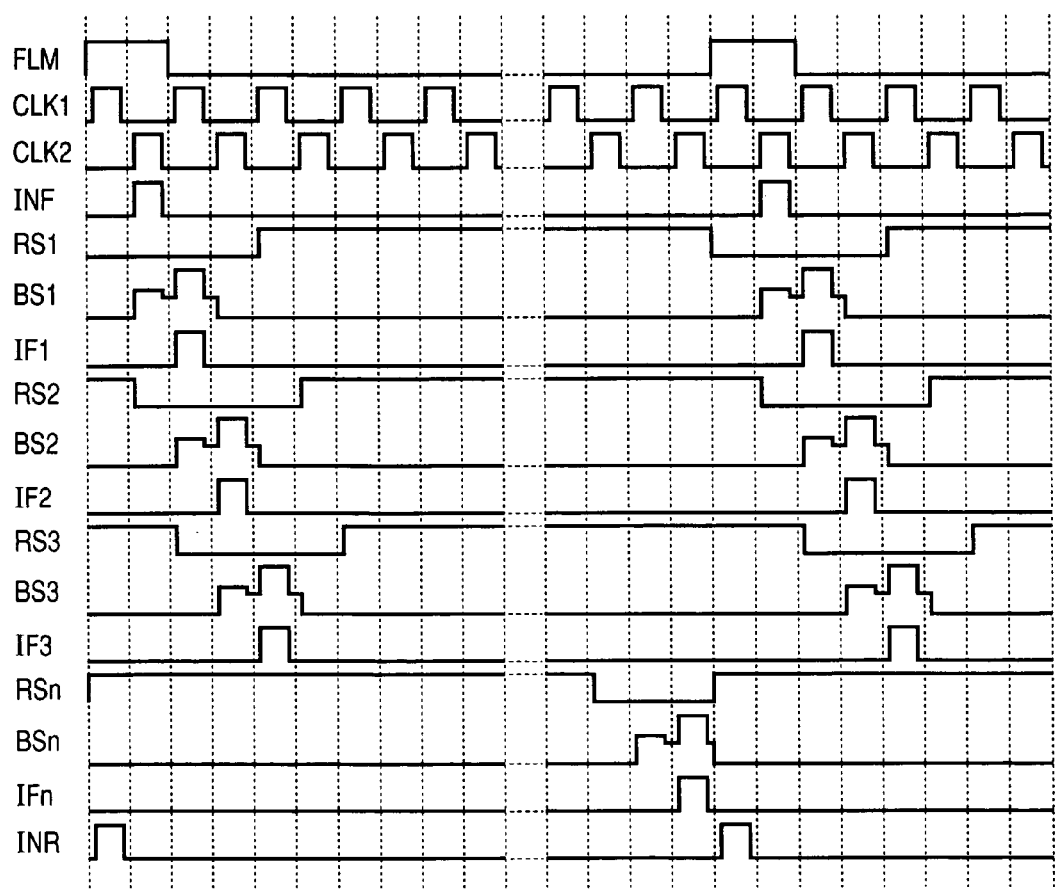
FIG. 6A is a timing chart of forward scanning by the bidirectional scanning circuit shown in FIG. 5.
Figure 6B:
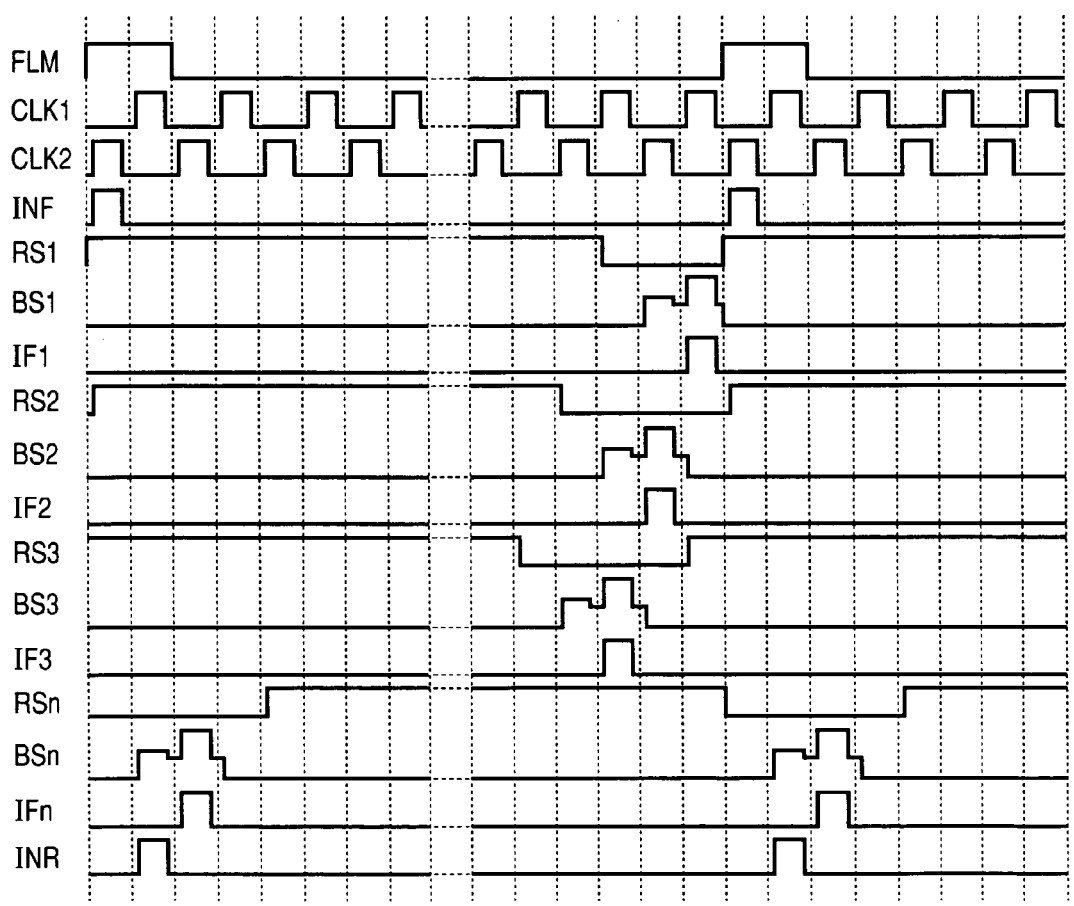
FIG. 6B is a timing chart of reverse scanning by the bidirectional scanning circuit shown in FIG. 5.

FIG. 5 shows a bidirectional scanning circuit with connections of an even number of the basic circuits. FIG. 6A shows a timing chart of forward scanning by the bidirectional scanning circuit shown in FIG. 5, and FIG. 6B shows a timing chart of reverse scanning by the bidirectional scanning circuit shown in FIG. 5.

Figure 7:
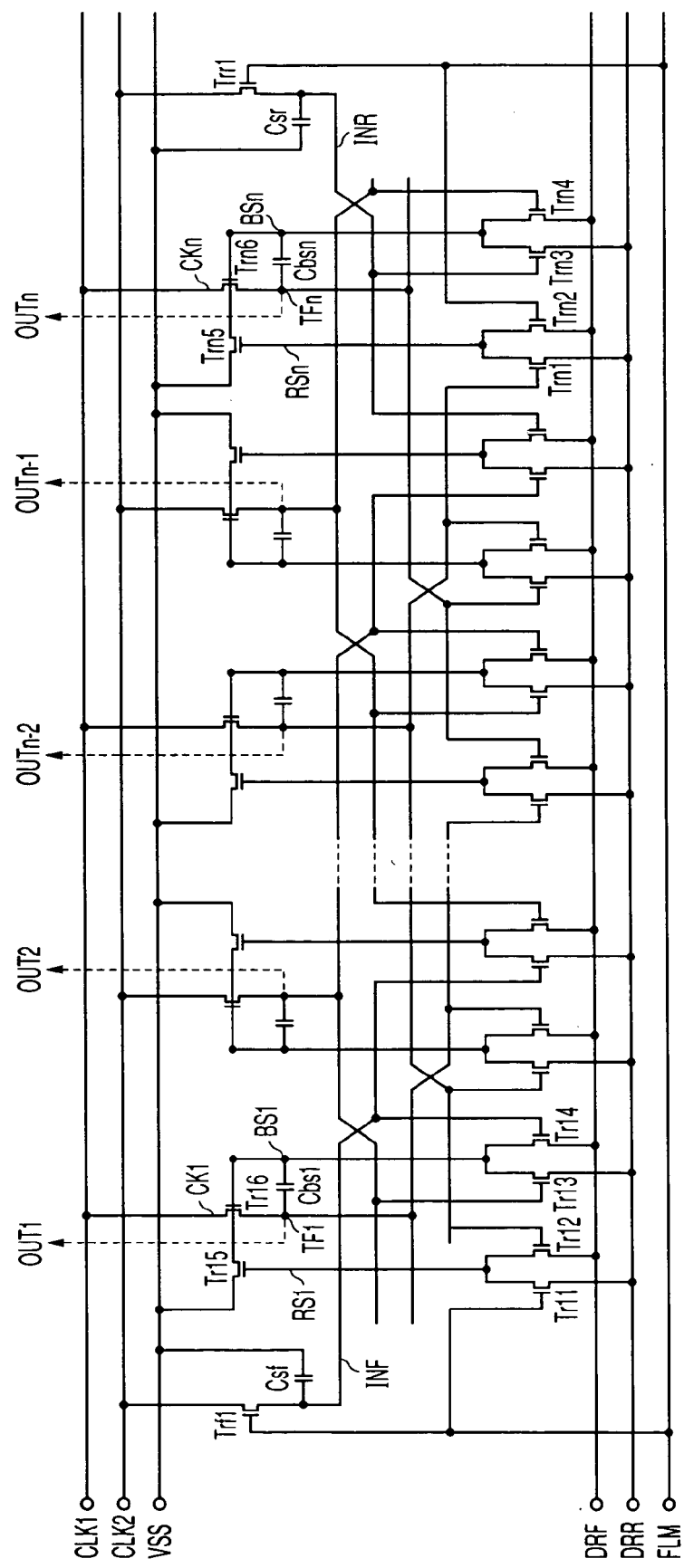
FIG. 7 is a circuit diagram showing a bidirectional scanning circuit configured by connecting an "n" number of basic circuits of FIG. 3 where the "n" is an odd number.
Figure 8A:
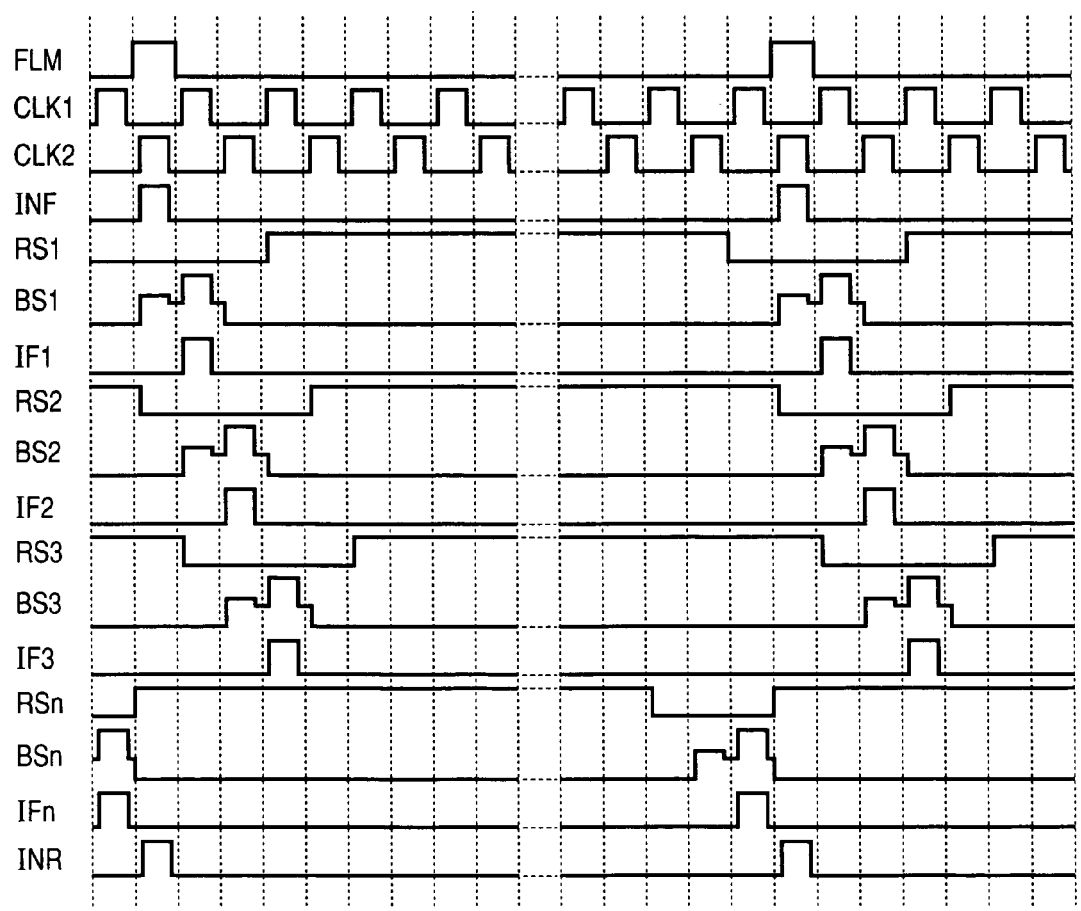
FIG. 8A is a timing chart of forward scanning by the bidirectional scanning circuit shown in FIG. 7.
Figure 8B:
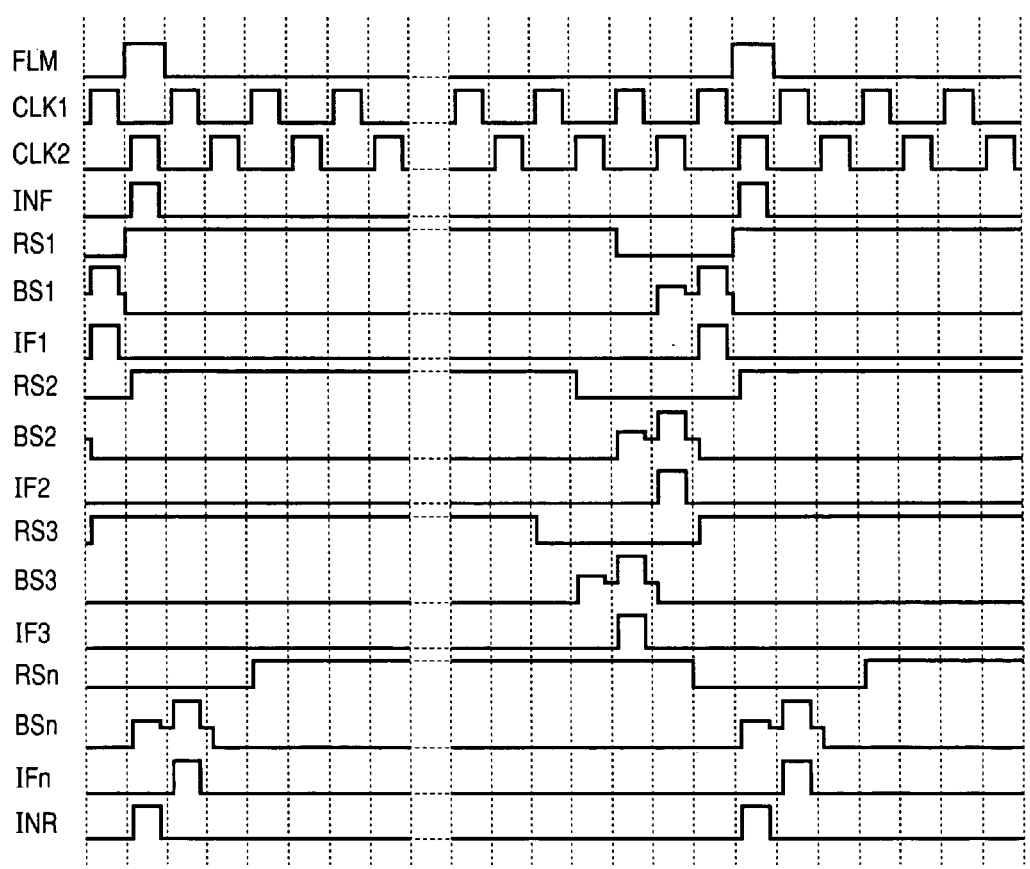
FIG. 8B is a timing chart of reverse scanning by the bidirectional scanning circuit shown in FIG. 7.

FIG. 7 shows a bidirectional scanning circuit with connections of an odd number of the basic circuits. FIG. 8A shows a timing chart of forward scanning by the bidirectional scanning circuit shown in FIG. 7, and FIG. 8B shows a timing chart of reverse scanning by the bidirectional scanning circuit shown in FIG. 7.

With outputs OUT1, OUT2, up to OUTn and a starting stage of sequential forward scanning as a reference, a CK terminal of an odd-numbered stage is connected to a clock signal line to which a clock signal CLK1 is supplied, and a CK terminal of an even-numbered stage is connected to a clock signal line to which a clock signal CLK2 is supplied.

The clock signals CLK1 and CLK2 are of the same period and differ in phase.

A pulse waveform of an FLM signal which is a starting signal of a frame depends on whether the number of stages is even or odd, and in the arrangement with an even number of stages, interchanging between the clock signals CLK1 and CLK2 is conducted along with the scanning direction control signals DRF and DRR when the scanning direction is changed.

At the ith stage of forward scanning, a TF output signal TF (i−2) developed two stages earlier with respect to the scanning direction corresponds to the IN1 terminal input in the basic circuit shown in FIG. 3. Similarly, a TF output signal TF (i−1) developed one stage earlier is corresponds to the IN2 terminal input, a TF output signal TF (i+1) developed one stage later corresponds to the IN3 terminal input, and a TF output signal TF (i+2) developed two stages later corresponds to the IN4 terminal input.

During forward scanning, the scanning direction control signal DRF takes the H-level and the scanning direction control signal DRR takes the L-level, and in terms of stage operation during forward scanning, the first stage slightly differs from other stages since the second and first preceding stages are absent. Likewise, the second stage slightly differs from other stages since the second preceding stage is absent, the (n−1)th stage slightly differs from other stages since the second following stage is absent, and the nth stage slightly differs from other stages since the first and second following stages are absent.

When such FLM signal and clock signals CLK1 and CLK2 as shown in FIG. 6 are input, the FLM signal is applied to a gate of an NMOS (Tr11) in the bidirectional scanning circuit of FIG. 5. During forward scanning, therefore, when the FLM signal is of the H-level, the NMOS (Tr11) sets an RS1 node of the first stage to the L-level.

Next when the clock signal CLK2 takes the H-level with the FLM signal in the H-level state, a potential obtained by subtracting the threshold voltage (Vth) from the H-level is written into an INF node via an NMOS (Trf1).

The signal that has been input to the INF node is equivalent to the IN2 input signal of the first stage and to the IN1 input signal of the second stage, whereby the first stage and the second stage become able to operate.

Similarly, when the clock signal CLK1 takes the H-level with the FLM signal in the H-level state, a potential obtained by subtracting the threshold voltage (Vth) from the H-level is written into an INR node via an NMOS (Trr1).

The signal that has been input to the INR node becomes the IN4 input signal of the (n−1)th stage and the IN3 input signal of the nth stage. The FLM signal becomes the IN4 input signal of the nth stage.

In this case, although the IN4 input signal and the IN3 input signal of the nth stage become inputs of the same timing, there is no problem since a BSn node is set to the L-level at the same time via an NMOS (Trn3) and an NMOS (Trn5).

During reverse scanning, the operation is reversed and the timing chart thereof is shown in FIG. 6B. During reverse scanning, the scanning direction control signal DRF takes the L-level and the scanning direction control signal DRR takes the H-level.

In an arrangement with an odd number of stages, both the clock signal line connected to the source (or drain) of the NMOS (Trf1) and the clock signal line connected to the source (or drain) of the NMOS (Trr1) become CLK2 clock signal lines. This does not occur in the arrangement with an even number of stages.

With the above arrangement, the FLM signal also exhibits the pulse waveform shown in FIGS. 8A, 8B. The operation itself, however, basically remains unchanged.

The TF node is a floating node when an NMOS (Trn6) is off. The TF node is therefore susceptible to effects of capacitive coupling and the like. However, when the NMOS (Trn5) is turned on, the BS node becomes at a stable VSS reference potential and the TF node is stabilized by a capacitive element (Cbsn).

The INF node and the INR node, however, are floating nodes, which do not have such a stabilizing capacity as mentioned above.

Accordingly, the INF node and the INR node are susceptible to capacitive coupling due to gate capacities and gate-off capacities of the transistors whose gates are connected to the INF node and the INR node.

For example, if the INR node has a small load capacity, when the potential of the BSn node increases during forward scanning, coupling due to a gate-off capacity of the NMOS (Trn3) raises the potential of the INR node. If this potential exceeds the threshold voltage (Vth), the NMOS (Trn3) is turned on and when the NMOS (Trn4) is also turned on, the signal line to which the scanning direction control signal DRF, and the signal line to which the scanning direction control signal DRR are directly connected via the NMOS (Trn3) and the NMOS (Trn4). As a result, in bootstrap timing of the BSn node, the bootstrap potential decreases since the L-level is written via the NMOS (Trn3) at the same time.

For example, if the BSn node is bootstrapped during forward scanning, when the INR node has a small load capacity, coupling due to the gate-off capacity of the NMOS (Trn3) raises the potential of the INR node.

Hence, the operation is stabilized by providing capacitive elements Csf and Csr to obtain a stable potential, for example, the reference potential of VSS, which prevents an erroneous operation.

The present invention can be constructed not only with a MOS single channel configuration based on n-type thin-film transistors, but also a pMOS single channel configuration based on p-type thin-film transistors.

Figure 9:
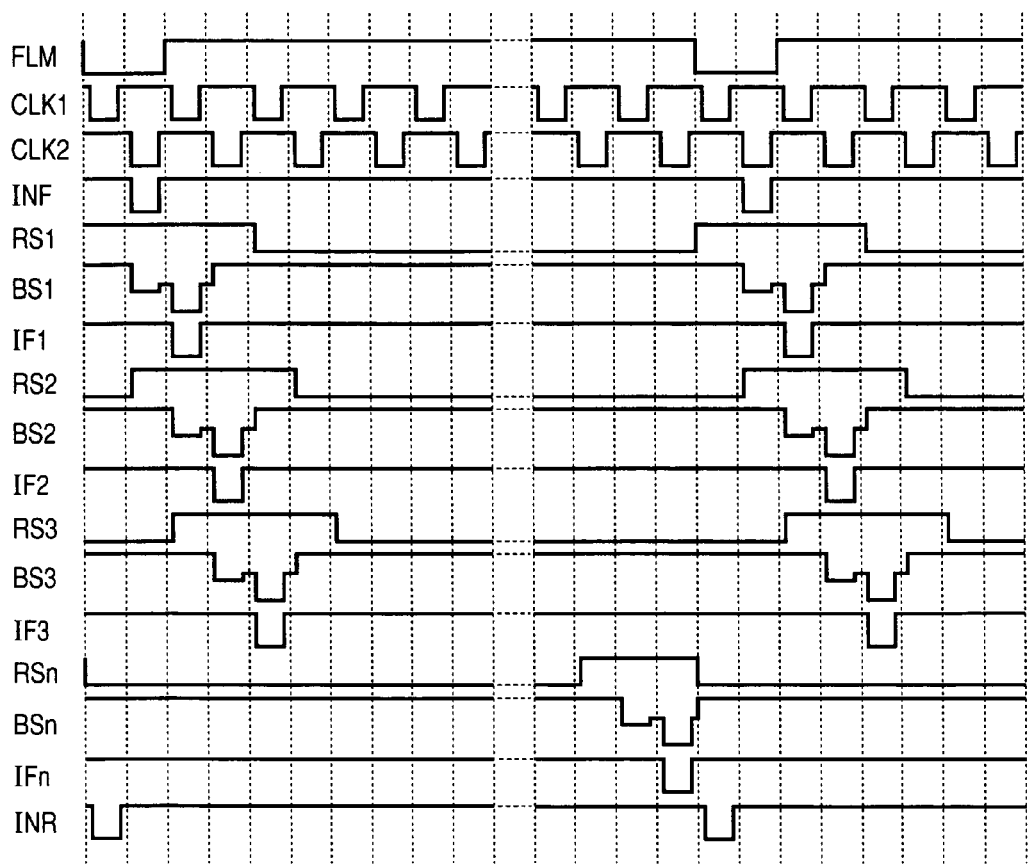
FIG. 9 is a timing chart of forward scanning when the bidirectional scanning circuit shown in FIG. 5 is arranged with a p-type thin-film transistor.

In the latter case, reference potential VSS is defined as an H-level, and when scanning direction control signals DRF and DRR are of an L-level and an H-level, respectively, scans are conducted in a forward direction. Conversely, when scanning direction control signals DRF and DRR are of the H-level and the L-level, respectively, scans are conducted in a reverse direction. That is to say, the logic is reversed. For example, a timing chart obtained during forward scanning in an even-number stage arrangement will be as shown in FIG. 9.

In the basic circuit of FIG. 3, the RS node that is the gate node of the NMOS (Tr5) needs to take the H-level, except before and after signal writing, in order to assign the reference potential of VSS to the BS node. When electric power is turned on, however, the signal level of the RS node is not constant and not determined until scanning is conducted. Thus, an erroneous operation may occur during power-on.

Figure 10:
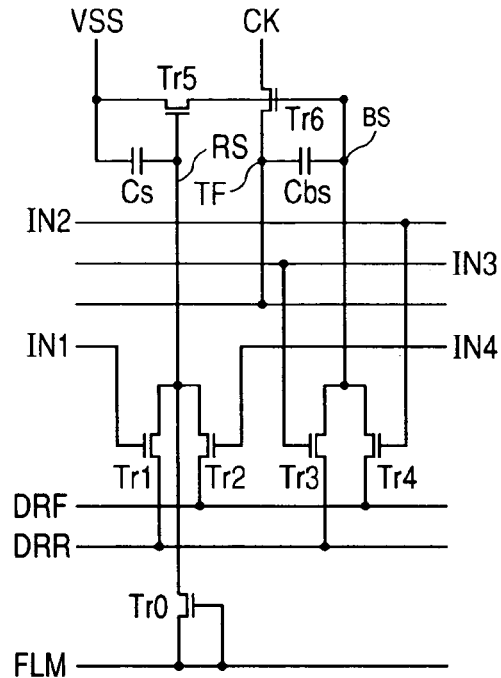
FIG. 10 is a circuit diagram showing a modification of the basic circuit shown in FIG. 3.

For this reason, as shown in FIG. 10, a source (or a drain) of an NMOS (tr0) whose gate and drain (or source) are already connected to the FLM signal line is connected to the RS node, whereby the FLM signal is input and at the same time an H-level potential is written into the RS node.

The RS node in the basic circuit of FIG. 3 is a floating gate. The RS node is therefore susceptible to capacitive coupling due to the gate-off capacities of the NMOS (Tr5) and NMOS (Tr2).

After the H-level potential is written, it is also necessary to hold the H-level until next writing starts. Therefore, providing a load capacitive element (Cs) for a stable reference, for example, the reference potential of VSS, as shown in FIG. 10, makes the operation less susceptible to capacitive coupling, resulting in increased stability.

The potential of the BS node in the basic circuit of FIG. 3 is increased to a maximum of nearly twice as large as the H-level potential by the bootstrap effect obtained during writing.

This means that a significant difference in potential occurs between the drain and source of the NMOS (Tr5) and between the drain and the source of the NMOS (Tr3) or NMOS (Tr4). The difference in potential presents the problem of whether the circuit can withstand a particular voltage.

Figure 11:
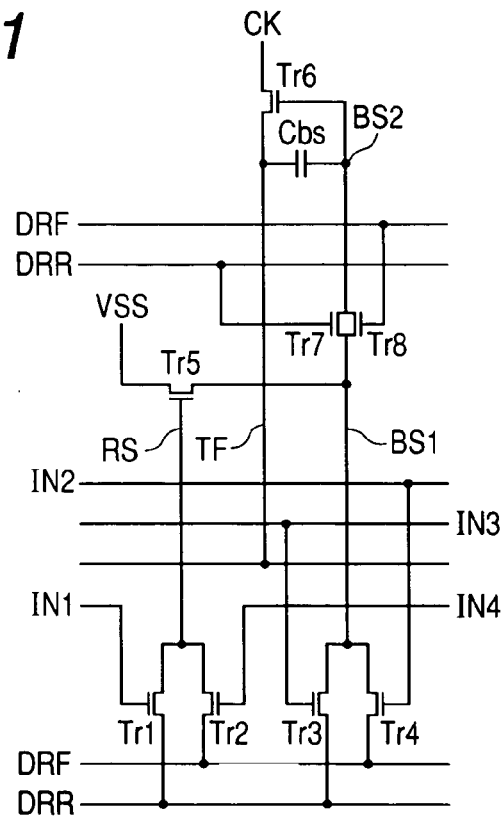
FIG. 11 is a circuit diagram showing another modification of the basic circuit shown in FIG. 3.

As shown in FIG. 11, therefore, a switch is installed that is formed up of an NMOS (Tr7) and an NMOS (Tr8). Thus, when the scanning direction control signals DRF and DRR are applied to the respective gates of the above two transistors, even if the potential of the BS node is increased above the H-level potential by the bootstrap effect, only a potential obtained by subtracting the threshold voltage (Vth) of the NMOS (Tr8) from the H-level is applied to a BS1 node since gate voltages of the NMOS (Tr7) and NMOS (Tr8) are maintained at the H-level potential. Accordingly, a potential difference exceeding the H-level potential is prevented from being generated at the drain-source section of any transistor. A circuit capable of withstanding a high voltage can thus be realized.

The TF node in the basic circuit of FIG. 3 functions as a scanning signal output node as well as the output node for transferring the signal to the next stage.

That is to say, for example, if the TF node is connected to a gate line, the load capacity connected to the TF node increases, which increases the amount of electric charge to be supplied to the TF node and significantly affects driving capabilities.

In addition, since the TF node directly suffers the effects of a change in potential with respect to an output line, the TF node may operate erroneously or stop operating.

Figure 12:
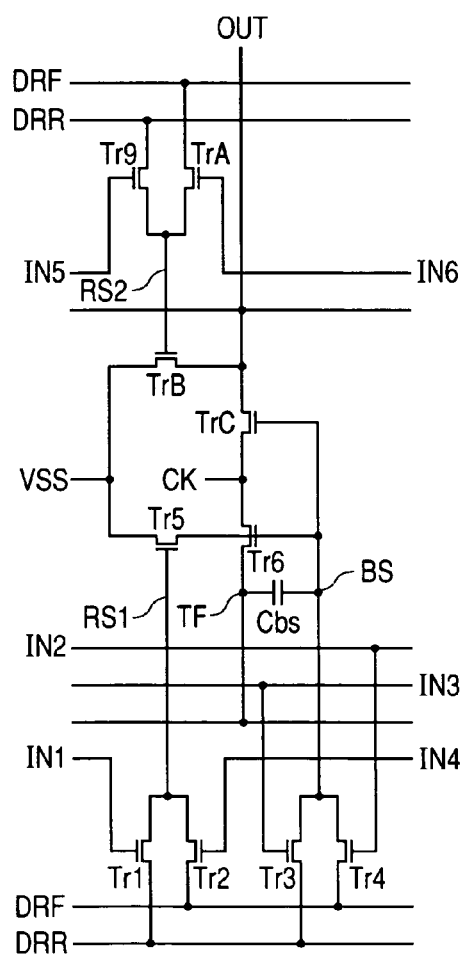
FIG. 12 is a circuit diagram showing yet another modification of the basic circuit shown in FIG. 3.

As shown in FIG. 12, therefore, an MNOS (TrC) is provided that has a gate connected to the BS node and a drain (or source) connected to the clock signal line to which the source (or drain) of the NMOS (Tr6) is connected. Thus, the same output signal can be supplied from different transistors.

This makes it possible to connect the OUT node to a gate line and remove a load of the gate line of the TF node, and hence to suppress the effects of changes in potential.

Additionally, since the output node becomes a floating node except during output, an RS flip-flop circuit is provided that is formed up of an NMOS (TrB) for maintaining the reference potential of VSS at all times, an NMOS (Tr9), and an NMOS (TrA).

The RS flip-flop conducts resetting during pre-stage output, that is, resets an RS2 node to the L-level, and conducts setting during post-stage output, that is, sets the RS2 node to the H-level. Thus, the reference potential of VSS can be maintained, except in write timing.

In the circuit of FIG. 12, output node OUT is connected to the reference potential line of VSS, except in write timing.

Since the output node is connected to the reference potential line of VSS via the NMOS (TrB), however, some extent of time is required to converge to the reference potential of VSS for any changes in potential due to capacitive coupling or the like.

This means that if the change in potential exceeds the threshold voltage (Vth), a leakage current may flow due to the possible momentary turn-on of the NMOS (Tr9) or of the NMOS (TrA) even when this change is momentary.

The output node OUT, if connected to a gate line or the like, may suffer continuous changes in potential due to capacitive coupling or the like. Since the RS2 node is a floating node, the RS2 node may not maintain the H-level due to the leakage current.

Figure 13:
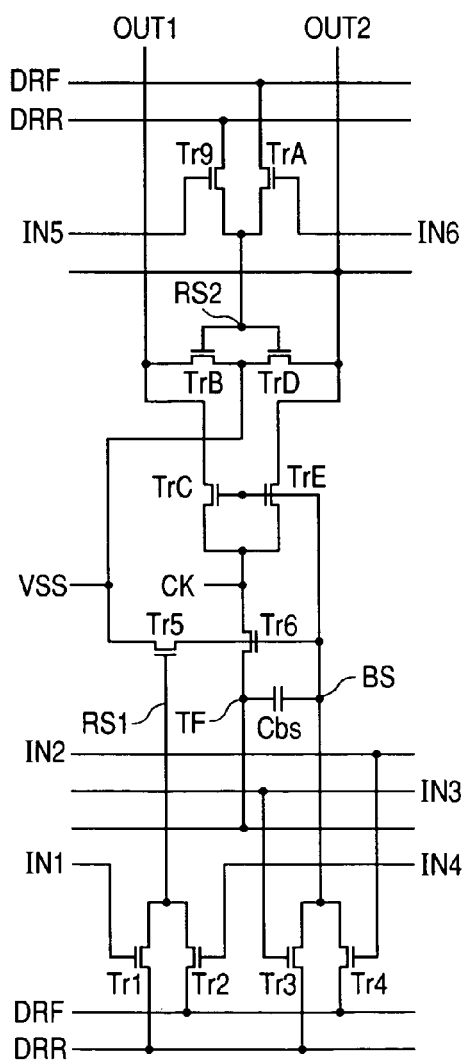
FIG. 13 is a circuit diagram showing a further modification of the basic circuit shown in FIG. 3.

Accordingly, as shown in FIG. 13, another pair of transistors, namely, an output NMOS (TrE) and an NMOS (TrD) for ensuring the reference potential of VSS, are provided. The transistor that supplies the RS flip-flop input signal and the transistor that supplies the scanning signal are separated from each other. This method renders the two transistors less susceptible to any effects of each other. The method also makes it possible to provide any number of output lines.

In the circuit of FIG. 12 or 13, as in FIG. 10, the source (or drain) of the transistor having the drain (or source) connected to the FLM signal line may be connected to the RS2 node to ensure that when the FLM signal is input, the H-level potential is written into the RS2 node at the same time.

In addition, as in FIG. 10, connecting a load capacitive element (Cs) for a stable potential, for example, the reference potential of VSS, to the RS2 node makes the node less susceptible to capacitive coupling, and thus enables stability to be increased.

In the basic circuit of FIG. 3, when the clock signal of the H-level is output from the TF node, the signal maintains the H-level as it is. This enables transmission without attenuation to the next stage, so the H-level can be written into the gate of the NMOS (Tr3) or of the NMOS (Tr4) and a potential obtained by subtracting the threshold voltage (Vth) from the H-level can be written into the BS node.

In the bidirectional scanning circuit of FIG. 5, however, since a potential obtained by subtracting the threshold voltage (Vth) from the H-level is supplied to the INF node during forward scanning, a potential equivalent to twice the potential obtained by subtracting the threshold voltage (Vth) from the H-level is supplied to the BS1 node via an NMOS (Tr14).

In other words, a sufficient H-level cannot be supplied to the BS1 node, and it is difficult to reduce the voltage. These usually do not occur at other stages.

The INF node is a floating node and easily suffers changes in potential due to capacitive coupling. During forward scanning, when the INF node is set to the H-level, the NMOS (Tr14) is turned on and the scanning direction control signal DRF is supplied to the BS1 node.

At this time, the bootstrap effect increases the potential of the INF node via a gate-on capacity of the NMOS (Tr14). A rate of this increase is determined by a ratio of the gate capacity of the NMOS (Tr14) to the load capacity of the INF node.

Figure 14:
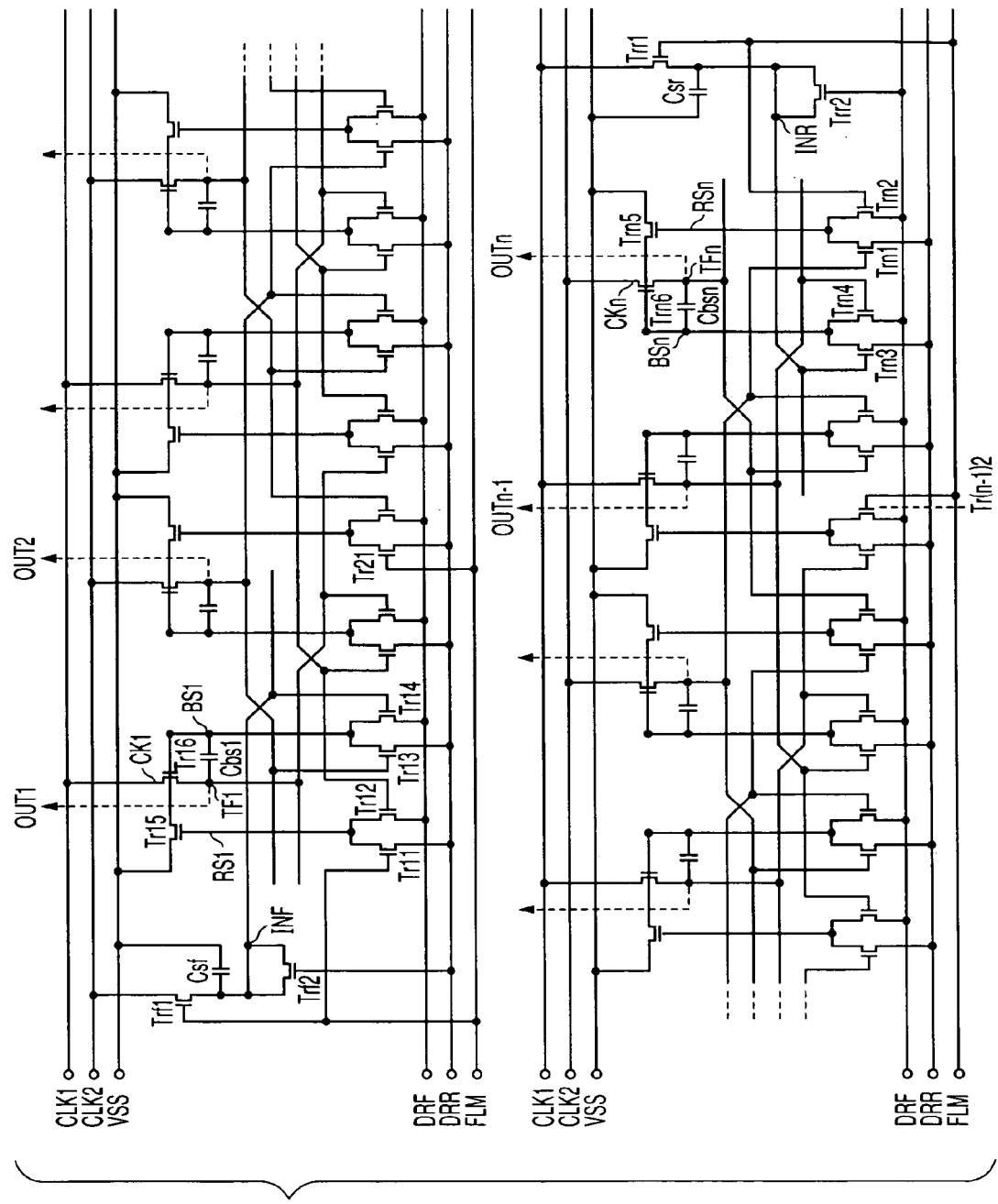
FIG. 14 is a circuit diagram showing a modification of the bidirectional scanning circuit shown in FIG. 5.

Accordingly, as shown in FIG. 14, a gate of an NMOS (Tr21) is connected to the FLM signal line to which the FLM signal is supplied. With a load capacitive element (Csf) with a reduced load capacity, the increase rate can be obtained depending on the value of the gate capacity, which makes it possible to sufficiently turn on the NMOS (Tr14).

In this case, turn-on timing of the NMOS (Tr21) is one clock earlier or later than in the circuit configuration of FIG. 5. That is to say, the RS node shown in FIG. 3 is set to the L-level one clock earlier or set to the H-level one clock later.

In this case, although a floating duration of the BS node is extended, the resulting effects are considered to be insignificant, because the increased clock timing includes three stages before the write timing and three stages after the write timing and is in the L-level period.

However, as described earlier, stability is lost if the load capacity of INF node is too small.

In the bidirectional scanning circuit of FIG. 5, two gates, the NMOS (Tr14) and NMOS (Tr21), are connected to the INF node.

When the BS1 node or the RS1 node changes in potential, capacitive coupling affects the INF node via the gate-on capacities or gate-off capacities of the NMOS (Tr14) and NMOS (Tr21).

During forward scanning, the INF node becomes an L-level floating state when writing is conducted at the first stage, that is, after the bootstrap timing of the BS1 node. When potential tends to increase, therefore, circuit operation is affected by the difference between an potential obtained by subtracting the threshold voltage (Vth) from the H-level of the BS1 node and a potential equivalent to an increment due to the bootstrap effect, and by the difference between the potential at the L-level of the RS1 node and the potential obtained by subtracting the threshold voltage (Vth) from the H-level of the BS1 node, the potential obtained by the subtraction having been written. When potential tends to decrease, circuit operation is affected by the difference in potential due to a change from the H-level of the FLM signal to the L-level, and by the difference between the increment in the potential of the BS1 node due to the bootstrap effect and the potential at which the node has changed to the L-level. That is to say, changes in potential are insignificant when the potential tends to increase.

During reverse scanning, when potential tends to increase, the BS1 node is considered to be affected by the difference in potential due to an increase from the L-level to the potential raised by the bootstrap effect. When potential tends to decrease, the FLM signal is considered to be affected by the difference in potential due to the change from the H-level to the L-level, the BS1 node is considered to be affected by a differential potential equivalent to an increment due to the bootstrap effect, and the RS2 node is considered to be affected by the differential potential obtained when a potential obtained by subtracting the threshold voltage (Vth) from the H-level is maintained at the L-level.

Since capacitive coupling affects the BS1 node via the gate-off capacity of the NMOS (Tr14) according to the particular differential potential between the L-level and a potential equivalent to the increment due to the bootstrap effect, the potential of the INF node is likely to exceed the threshold voltage (Vth) of the NMOS (Tr14).

That is, in the bootstrap timing, the NMOS (Tr14) may be turned on and write the L-level. Also, the inverse of this applies to the INR node.

It is therefore preferable that, during forward scanning, the load capacity of the INF node be smaller and that of the INR node be larger, and that during reverse scanning, the load capacity of the INF node be larger and that of the INR node be smaller.

Accordingly, as shown in FIG. 14, the gate of the NMOS (Tr21) and that of an NMOS (Tr(n−1)2 are connected to the FLM signal line to which the FLM signal is supplied. The effects of both transistors' gate capacities on the INF node and on the INR node are thus eliminated. Also, two more transistors are added. One is an NMOS (Trf2) having a drain and a source each connected to the INF node, and a gate connected to the DRR line to which the scanning direction control signal DRR is supplied. The other is an NMOS (Trr2) having a drain and a source each connected to the INR node, and a gate connected to the DRF line to which the scanning direction control signal DRF is supplied.

Thus, during forward scanning, the scanning direction control signal DRR is of the L-level, the NMOS (Trf2) is off, and the load capacity with respect to the INF node is reduced to the gate-off capacity. Also, the scanning direction control signal DRF is of the H-level, the NMOS (Trr2) is on, and the load capacity with respect to the INR node is increased to the gate-on capacity. The inverse of the above occurs during reverse scanning. High bootstrap efficiency and stability can be obtained.

In the basic circuit of FIG. 3, when the potential of the BS node is increased by the bootstrap effect, the potential of the RS node is also increased by capacitive coupling due to the gate-off capacity of the NMOS (Tr5) since the RS node is in a floating state when the potential of the BS node is increased.

Figure 15A:
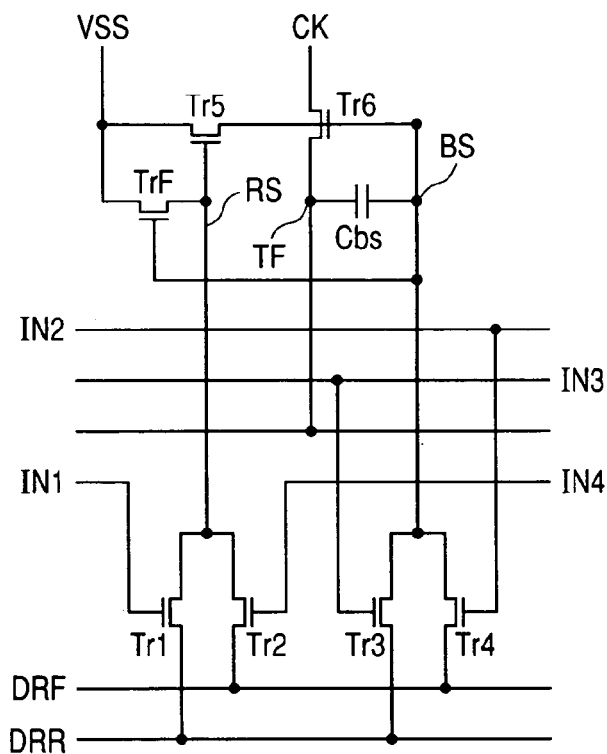
FIG. 15A is a circuit diagram showing a further modification of the basic circuit shown in FIG. 3.

Increases in the potential of the RS node can be suppressed by adding a load capacity with respect to this node. As shown in FIG. 15A, for more reliable suppression, however, an addition of an NMOS (TrF) having a gate connected to the BS node, a drain (or source) connected to the RS node, and a source (or drain) connected to the reference potential line of VSS, always makes it possible to fix the RS node at the reference potential of VSS when the potential of the BS node is increased. The effects of capacitive coupling can thus be suppressed.

Figure 15B:
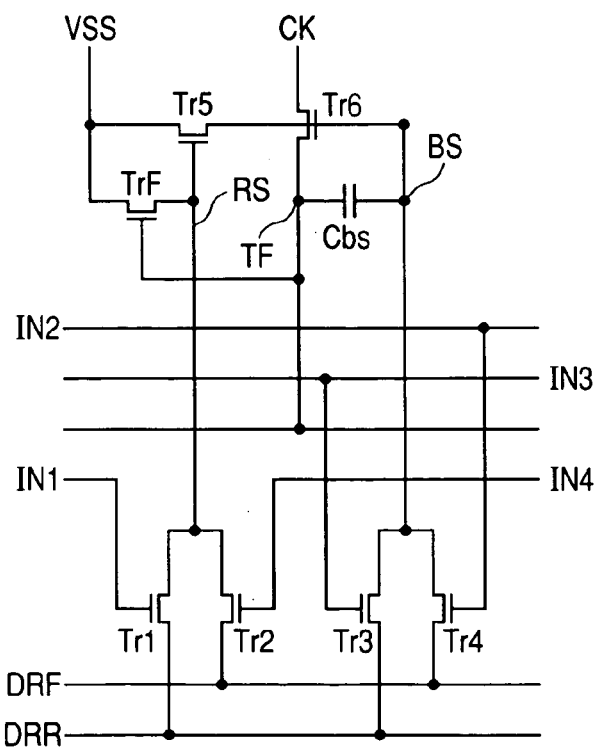
FIG. 15B is a circuit diagram showing a further modification of the basic circuit shown in FIG. 3.

If the timing of setting the BS node to the L-level and that of setting the RS node to the H-level overlap with each other, the gate of the NMOS (TrF) is connected to the TF node, as shown in FIG. 15B. This method is also effective for the RS2 node shown in FIG. 12. In this case, two configurations are possible. In one configuration, the gate can be connected to the BS node, and in the other configuration, the gate can be connected to an OUT node. For connection to the BS node, since the timing of setting the RS2 node to the H-level and the timing of setting the BS node to the L-level become the same, an IN5 terminal and an IN6 terminal are connected to the OUT nodes of the second stages located next to immediately preceding and following stages, instead of the OUT nodes of the immediately preceding and following stages.

Figure 16:
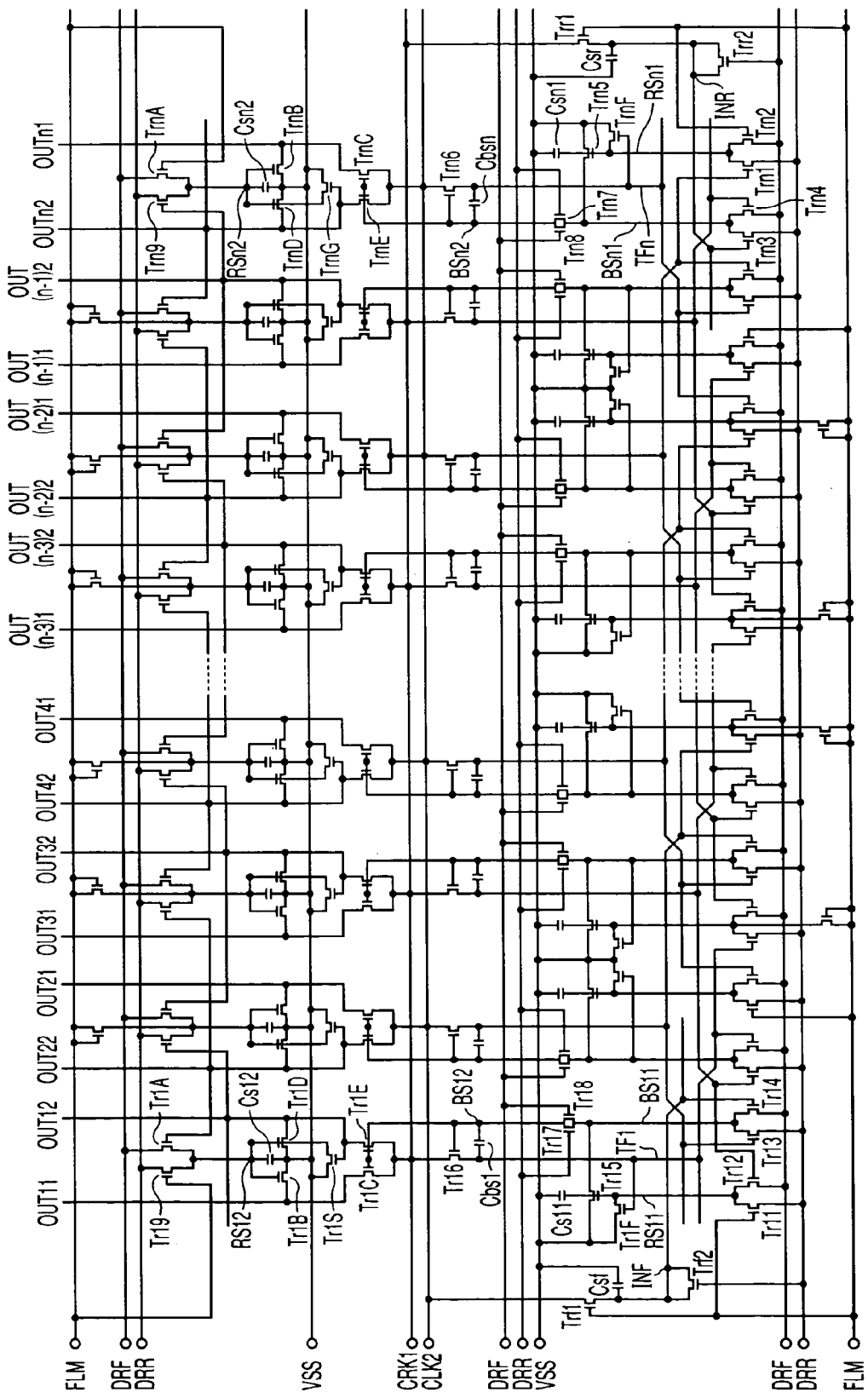
FIG. 16 is a circuit diagram of a bidirectional scanning circuit configured by incorporating all the modifications shown in FIGS. 10 to 15.
Figure 17A:
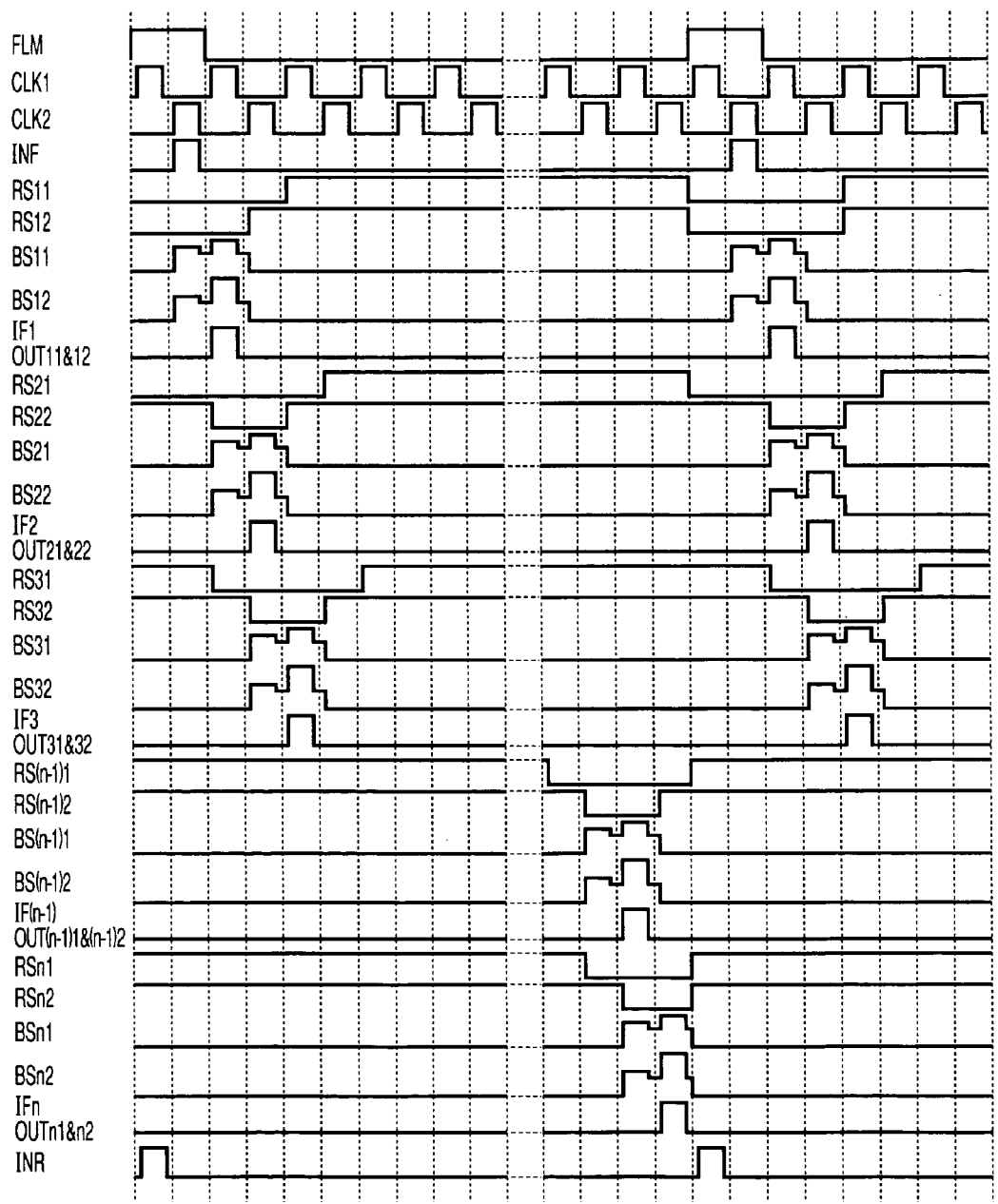
FIG. 17A is a timing chart of forward scanning by the bidirectional scanning circuit shown in FIG. 16.
Figure 17B:
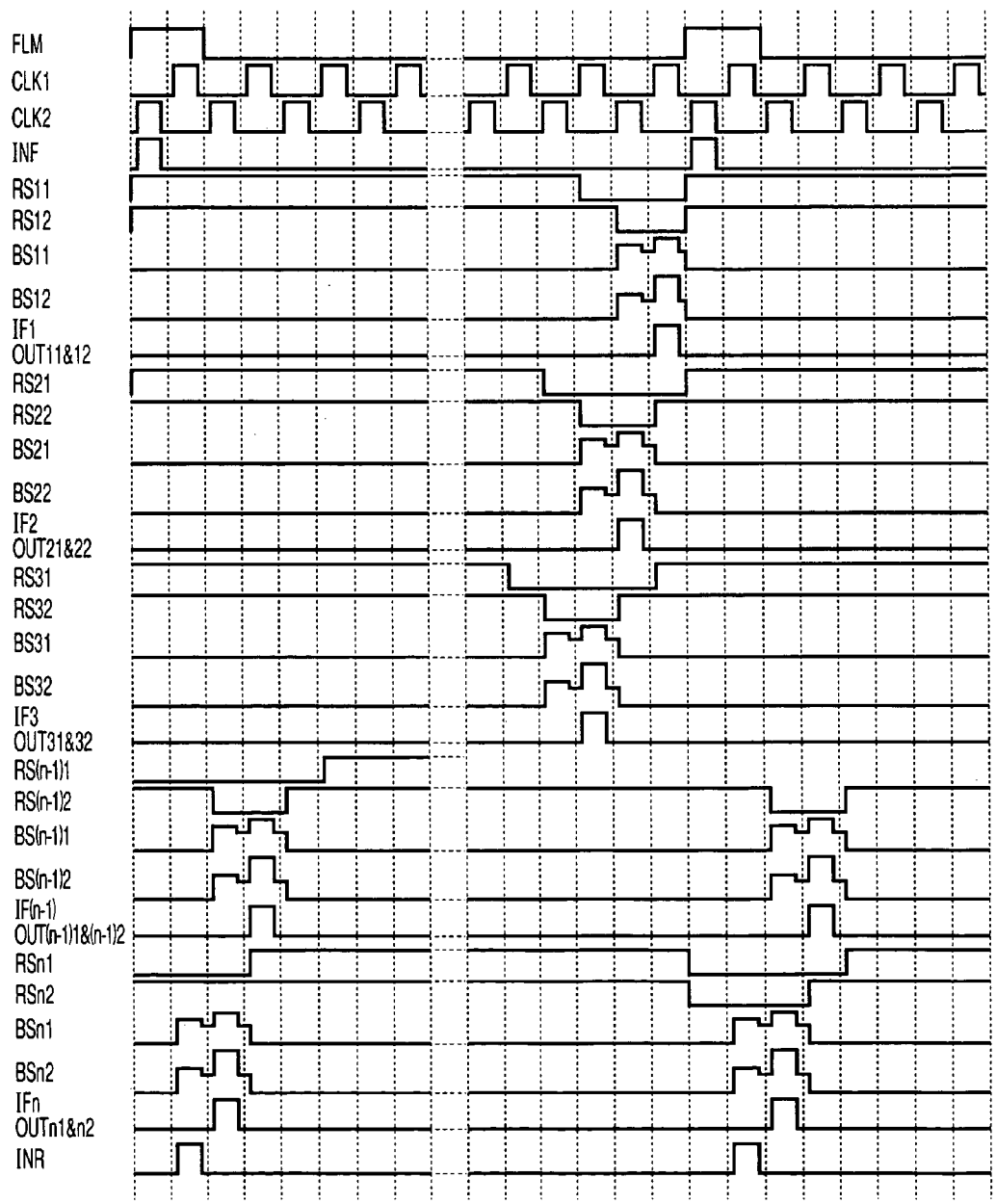
FIG. 17B is a timing chart of reverse scanning by the bidirectional scanning circuit shown in FIG. 16.
Figure 20A:
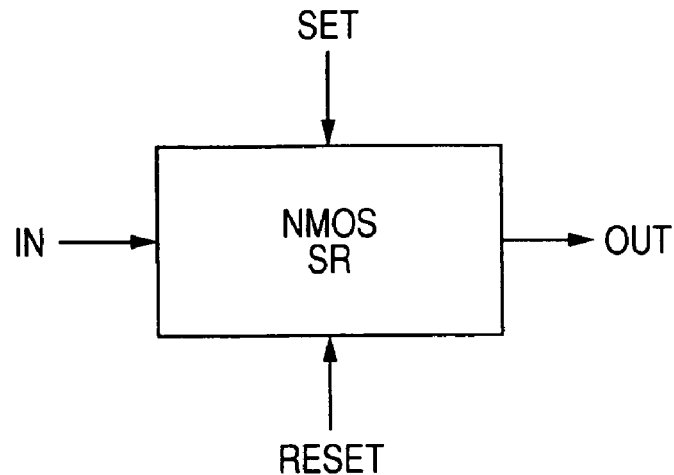
FIG. 20A is a diagram showing a schematic configuration of one stage of a single-channel shift register.
Figure 20B:
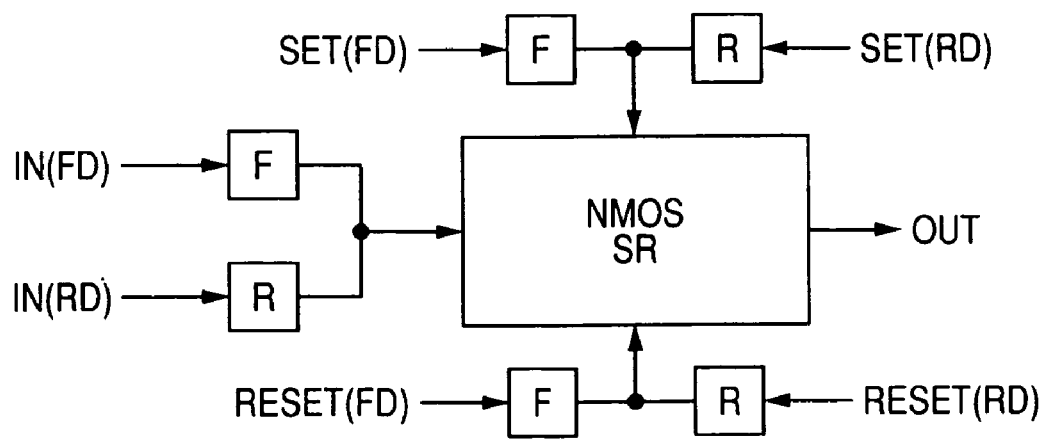
FIG. 20B is a diagram showing a schematic configuration of one stage of a single channel bidirectional shift register.

FIG. 16 is a circuit diagram of a bidirectional scanning circuit configured by incorporating all the advantageous effects described above. FIG. 17A is a timing chart of forward scanning by the bidirectional scanning circuit shown in FIG. 16, and FIG. 17B is a timing chart of reverse scanning by the bidirectional scanning circuit shown in FIG. 16.

As described above, although the conventional nMOS single-cannel circuits require a setting signal and a resetting signal in addition to input signals, the present embodiment acquires scanning direction control signals as a setting potential and a resetting potential and at the same time endows the circuit with a direction switching function, whereby a routing switch becomes unnecessary and the number of elements required can be correspondingly reduced.

Also, since the present embodiment provides one sharable signal path, instead of providing two paths, the number of signal paths can be reduced.

In addition, since the circuit configuration in the present embodiment is possible by using n-type or p-type single-channel elements, it is possible to reduce manufacturing processes, to achieve bidirectional scanning with one circuit, to reduce the circuit scale by reducing the number of elements and signal paths, and thereby to improve a yield.

While the case of using TFTs of the MOS (Metal-Oxide Semiconductor) type as the transistors has been described, general MOSFETs or MIS (Metal-Insulator Semiconductor) FETs or the like may be used instead.

Furthermore, while the embodiment of applying the present invention to a liquid crystal display device has been described above, the invention is not limited to the description and it goes without saying that the invention can also be applied to an EL display device that uses organic EL elements or the like.

While the invention made by the present inventor have been described according to the above embodiment, the invention is not limited to the embodiment and may be modified in various forms within the scope without departing from the spirit of the invention.

What is claimed is:

1. A display device comprising:
a plurality of pixels; and
a driving circuit for driving the plurality of pixels;
wherein:
the driving circuit includes a single channel bidirectional shift register adapted for bidirectional scanning in a first direction and a second direction;
the single channel bidirectional shift register includes an "n" number of basic circuits tandem-connected in multiple stages (wherein "n" is equal to or greater than 2);
the basic circuits each include a first circuit and a second circuit;
the first circuit of each basic circuit includes a first transistor having a first electrode connected to a first node, a second electrode connected to a second scanning control line to which a second scanning direction control signal is supplied, and a control electrode connected to a first output terminal of a first basic circuit on a side of a preceding stage in the first scanning direction, and a second transistor having a first electrode connected to the first node, a second electrode connected to a first scanning control line to which a first scanning direction control signal is supplied, and a control electrode connected to a second output terminal of a second basic circuit on a side of a following stage in the first scanning direction;
the second circuit of each basic circuit includes a third transistor having a first electrode connected to a second node, a second electrode connected to the second scanning control line, and a control electrode connected to a third output terminal of a third basic circuit on the side of the following stage in the first scanning direction, and a fourth transistor having a first electrode connected to the second node, a second electrode connected to the first scanning control line, and a control electrode connected to a fourth output terminal of a fourth basic circuit on the side of the preceding stage in the first scanning direction; and
wherein each of the basic circuits further includes:
a fifth transistor having a control electrode connected to the first node, a second electrode connected to the second node, and a first electrode connected to a reference potential line to which a reference potential is supplied;
a sixth transistor having a control electrode connected to the second electrode of the fifth transistor, a first electrode connected to a clock terminal, and a second electrode connected to an output terminal of the basic circuit; and
a first capacitive element connected between the second node and the output terminal of the basic circuit.

2. The display device according to claim 1, wherein each of the basic circuits includes a seventh transistor having a first electrode connected to the reference potential line, a second electrode connected to the control electrode of the fifth transistor, and a control electrode connected to the control electrode of the sixth transistor.

3. The display device according to claim 1, wherein each of the basic circuits includes an eighth transistor having a control electrode and a second electrode each connected to a frame signal line to which a starting signal of a frame is supplied, and having a first electrode connected to the control electrode of the fifth transistor.

4. The display device according to claim 1, wherein each of the basic circuits includes a second capacitive element connected between the reference potential line and the control electrode of the fifth transistor.

5. The display device according to claim 1, wherein each of the basic circuits includes:
a ninth transistor connected between the control electrode of the sixth transistor and the second electrode of the fifth transistor, the ninth transistor having a control electrode connected to the first scanning control line; and
a tenth transistor connected between the control electrode of the sixth transistor and the second electrode of the fifth transistor, the tenth transistor having a control electrode connected to the second scanning control line.

6. The display device according to claim 1, wherein each of the basic circuits includes an eleventh transistor having a control electrode connected to the control electrode of the sixth transistor, a first electrode connected to a clock terminal, and a second electrode connected to an external output terminal.

7. The display device according to claim 6, wherein each of the basic circuits includes:
- a twelfth transistor having a first electrode to which the reference potential is applied, and a second electrode connected to the second electrode of the eleventh transistor;
- a thirteenth transistor having a first electrode connected to the control electrode of the twelfth transistor, a second electrode connected to the second scanning control line, and a control electrode connected to an external output terminal of an immediately preceding basic circuit in the first scanning direction; and
- a fourteenth transistor having a first electrode connected to the control electrode of the twelfth transistor, a second electrode connected to the first scanning control line, and a control electrode connected to an external output terminal of an immediately following basic circuit in the first scanning direction.

8. The display device according to claim 7, wherein each of the basic circuits includes a fifteenth transistor having a control terminal and a second electrode each connected to the frame signal line, and a first electrode connected to the control electrode of the twelfth transistor.

9. The display device according to claim 7, wherein each of the basic circuits includes a third capacitive element connected between the reference potential line and the control electrode of the twelfth transistor.

10. The display device according to claim 1, wherein each of the basic circuits includes:
- a sixteenth transistor having a control electrode connected to the control electrode of the sixth transistor, a first electrode connected to a clock terminal, and a second electrode connected to a first external output terminal; and
- a seventeenth transistor having a control electrode connected to the control electrode of the sixth transistor, a first electrode connected to a clock terminal, and a second electrode connected to a second external output terminal.

11. The display device according to claim 10, wherein each of the basic circuits includes:
- an eighteenth transistor having a first electrode connected to the reference potential line and a second electrode connected to the second electrode of the sixteenth transistor;
- a nineteenth transistor having a first electrode connected to the reference potential line and a second electrode connected to the second electrode of the seventeenth transistor;
- a twentieth transistor having a first electrode connected to the control electrodes of the eighteenth and nineteenth transistors, a second electrode connected to the second scanning control line, and a control electrode connected to a second external output terminal of an immediately preceding basic circuit in the first scanning direction; and
- a twenty-first transistor having a first electrode connected to the control electrodes of the eighteenth and nineteenth transistors, a second electrode connected to the first scanning control line, and a control electrode connected to a second external output terminal of an immediately following basic circuit in the first scanning direction.

12. The display device according to claim 11, wherein each of the basic circuits includes a twenty-second transistor having a control terminal and a second electrode each connected to the frame signal line, and a first electrode connected to the control electrodes of the eighteenth and nineteenth transistors.

13. The display device according to claim 11, wherein each of the basic circuits includes a fourth capacitive element connected between the reference potential line and the control electrodes of the eighteenth and nineteenth transistors.

14. The display device according to claim 1, wherein:
- a clock terminal of a basic circuit at an odd-numbered stage in the first scanning direction is connected to a first clock signal line to which a first clock signal is supplied;
- a clock terminal of a basic circuit at an even-numbered stage in the first scanning direction is connected to a second clock signal line to which a second clock signal is supplied; and
- the first clock signal and the second clock signal are of the same period and differ in phase.

15. The display device according to claim 1, wherein the basic circuit located at the (n−2)th stage based on the third stage in the first scanning direction is configured such that:
- the control electrode of the first transistor is connected to an output terminal of the basic circuit located at the second preceding stage;
- the control electrode of the second transistor is connected to an output terminal of the basic circuit located at the second following stage;
- the control electrode of the third transistor is connected to an output terminal of the basic circuit located at the first following stage; and
- the control electrode of the fourth transistor is connected to an output terminal of the basic circuit located at the first preceding stage.

16. The display device according to claim 15, further comprising a twenty-third transistor having a control electrode connected to the frame signal line and a first electrode connected to the second clock signal line, wherein the basic circuit at the first stage in the first scanning direction is configured such that:
- the control electrode of the first transistor is connected to the frame signal line;
- the control electrode of the second transistor is connected to an output terminal of the basic circuit located at the third stage;
- the control electrode of the third transistor is connected to an output terminal of the basic circuit located at the second stage; and
- the control electrode of the fourth transistor is connected to a second electrode of the twenty-third transistor.

17. The display device according to claim 16, wherein the basic circuit at the second stage in the first scanning direction is configured such that:
- the control electrode of the first transistor is connected to the second electrode of the twenty-third transistor;
- the control electrode of the second transistor is connected to an output terminal of the basic circuit located at the fourth stage;
- the control electrode of the third transistor is connected to an output terminal of the basic circuit located at the third stage; and
- the control electrode of the fourth transistor is connected to an output terminal of the basic circuit located at the first stage.

18. The display device according to claim 16, wherein the basic circuit at the second stage in the first scanning direction is configured such that:
- the control electrode of the first transistor is connected to the frame signal line;

the control electrode of the second transistor is connected to an output terminal of the basic circuit located at the fourth stage;

the control electrode of the third transistor is connected to an output terminal of the basic circuit located at the third stage; and the control electrode of the fourth transistor is connected to an output terminal of the basic circuit located at the first stage.

19. The display device according to claim 16, further comprising a fifth capacitive element connected between the control electrode of the twenty-third transistor and the reference potential line.

20. The display device according to claim 16, further comprising a twenty-fourth transistor having a control electrode connected to the second scanning control line, and a first electrode and a second electrode each connected to the second electrode of the twenty-third transistor.

21. The display device according to claim 15, further comprising a twenty-fifth transistor having a control electrode connected to the frame signal line and a first electrode connected to the first clock signal line, wherein if "n" is an even number, the basic circuit located at the nth stage in the first scanning direction is configured such that:

the control electrode of the first transistor is connected to an output terminal of the basic circuit located at the (n−2)th stage;

the control electrode of the second transistor is connected to the frame signal line;

the control electrode of the third transistor is connected to a second electrode of the twenty-fifth transistor; and the control electrode of the fourth transistor is connected to an output terminal of the basic circuit located at the (n−1)th stage.

22. The display device according to claim 21, wherein:

in the first scanning direction, after the starting signal of the frame has become valid, a voltage level of the first clock signal changes first and then a voltage level of the second clock signal changes; and in the second scanning direction, after the starting signal of the frame has become valid, the voltage level of the second clock signal changes first and then the voltage level of the first clock signal changes.

23. The display device according to claim 15, further comprising a twenty-fifth transistor having a control electrode connected to the frame signal line and a first electrode connected to the second clock signal line, wherein if "n" is an odd number, the basic circuit located at the nth stage in the first scanning direction is configured such that:

the control electrode of the first transistor is connected to an output terminal of the basic circuit located at the (n−2)th stage;

the control electrode of the second transistor is connected to the frame signal line;

the control electrode of the third transistor is connected to a second electrode of the twenty-fifth transistor; and the control electrode of the fourth transistor is connected to an output terminal of the basic circuit located at the (n−1)th stage.

24. The display device according to claim 23, wherein:

in the first scanning direction or in the second scanning direction, after the starting signal of the frame has become valid, a voltage level of the second clock signal changes first and then a voltage level of the first clock signal changes.

25. The display device according to claim 21, wherein the basic circuit located at the (n−1)th stage in the first scanning direction is configured such that:

the control electrode of the first transistor is connected to an output terminal of the basic circuit located at the (n−3)th stage;

the control electrode of the second transistor is connected to a second electrode of the twenty-fifth transistor;

the control electrode of the third transistor is connected to an output terminal of the basic circuit located at the nth stage; and the control electrode of the fourth transistor is connected to an output terminal of the basic circuit located at the (n−2)th stage.

26. The display device according to claim 21, wherein the basic circuit located at the (n−1)th stage in the first scanning direction is configured such that:

the control electrode of the first transistor is connected to an output terminal of the basic circuit located at the (n−3)th stage;

the control electrode of the second transistor is connected to the frame signal line;

the control electrode of the third transistor is connected to an output terminal of the basic circuit located at the nth stage; and the control electrode of the fourth transistor is connected to an output terminal of the basic circuit located at the (n−2)th stage.

27. The display device according to claim 21, further comprising a sixth capacitive element connected between the second electrode of the twenty-fifth transistor and the reference potential line.

28. The display device according to claim 21, further comprising a twenty-sixth transistor having a control electrode connected to the second scanning control line, and a first electrode and a second electrode each connected to the second electrode of the twenty-fifth transistor.

29. A display device comprising:

a plurality of pixels; and a driving circuit for driving the plurality of pixels;

wherein:

the driving circuit includes a single channel bidirectional shift register adapted for bidirectional scanning in a first direction and a second direction;

the single channel bidirectional shift register includes a flip-flop circuit;

the flip-flop circuit includes a first transistor having a first electrode connected to a first node and a second electrode to which a second scanning direction control signal is applied, and a second transistor having a first electrode connected to the first node and a second electrode to which a first scanning direction control signal is applied;

the first transistor includes a control electrode to which a resetting signal is applied in a first scanning direction and to which a setting signal is applied in a second scanning direction which is a reverse direction to the first scanning direction;

the second transistor includes a control electrode to which the setting signal is applied in the first scanning direction and to which the resetting signal is applied in the second scanning direction;

each of the transistors is an n-type of transistor; and where the reference potential is defined as an L-level, and an H-level is defined as a voltage level of a potential higher than the reference potential, in the first scanning direction, a voltage level of a first scanning direction control signal is the H-level and a voltage level of a second scanning direction control signal is the L-level, and in the second scanning direction, a voltage level of a first scanning direction control signal is the L-level and a voltage level of a second scanning direction control signal is the H-level.

30. A display device comprising:

a plurality of pixels; and a driving circuit for driving the plurality of pixels;

wherein:

the driving circuit includes a single channel bidirectional shift register adapted for bidirectional scanning in a first direction and a second direction;

the single channel bidirectional shift register includes a flip-flop circuit;

the flip-flop circuit includes a first transistor having a first electrode connected to a first node and a second electrode to which a second scanning direction control signal is applied, and a second transistor having a first electrode connected to the first node and a second electrode to which a first scanning direction control signal is applied;

the first transistor includes a control electrode to which a resetting signal is applied in a first scanning direction and to which a setting signal is applied in a second scanning direction which is a reverse direction to the first scanning direction;

the second transistor includes a control electrode to which the setting signal is applied in the first scanning direction and to which the resetting signal is applied in the second scanning direction;

each of the transistors is a p-type of transistor; and where the reference potential is defined as an H-level, and an L-level is defined as a voltage level of a potential lower than the reference potential, in the first scanning direction, a voltage level of a first scanning direction control signal is the L-level and a voltage level of a second scanning direction control signal is the H-level, and in the second scanning direction, a voltage level of a first scanning direction control signal is the H-level and a voltage level of a second scanning direction control signal is the L-level.

31. The display device according to claim 1, wherein the driving circuit is a scan line driving circuit that scans each of the pixels for each display line.

32. The display device according to claim 1, wherein the driving circuit is an image line driving circuit that supplies an image voltage to each of the pixels.

* * * * *